United States Patent
Dobashi

(10) Patent No.: US 12,160,650 B2
(45) Date of Patent: Dec. 3, 2024

(54) SENSOR PACKAGE, METHOD OF MANUFACTURING THE SAME, AND IMAGING DEVICE

(71) Applicant: SONY SEMICONDUCTOR SOLUTIONS CORPORATION, Kanagawa (JP)

(72) Inventor: Eiichiro Dobashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 41 days.

(21) Appl. No.: 17/905,910

(22) PCT Filed: Mar. 3, 2021

(86) PCT No.: PCT/JP2021/008044
§ 371 (c)(1),
(2) Date: Sep. 8, 2022

(87) PCT Pub. No.: WO2021/187091
PCT Pub. Date: Sep. 23, 2021

(65) Prior Publication Data
US 2023/0117904 A1 Apr. 20, 2023

(30) Foreign Application Priority Data
Mar. 17, 2020 (JP) ................... 2020-046657

(51) Int. Cl.
*H04N 23/55* (2023.01)
*H01L 27/146* (2006.01)
*H04N 25/76* (2023.01)

(52) U.S. Cl.
CPC ....... *H04N 23/55* (2023.01); *H01L 27/14618* (2013.01); *H04N 25/76* (2023.01)

(58) Field of Classification Search
CPC ........ H04N 23/55; H04N 25/76; H04N 23/57; H04N 23/54; H01L 27/14618;
(Continued)

(56) References Cited

U.S. PATENT DOCUMENTS

| | | | |
|---|---|---|---|
| 2011/0156187 A1* | 6/2011 | Tu ..................... | H01L 27/14618 257/E31.127 |
| 2017/0023775 A1* | 1/2017 | Shigemitsu ........ | G02B 27/0025 |
| 2018/0035025 A1* | 2/2018 | Apelt ................ | H01L 31/02327 |

FOREIGN PATENT DOCUMENTS

| | | |
|---|---|---|
| JP | 2019-047237 A | 3/2019 |
| WO | 2019/235247 A1 | 12/2019 |

OTHER PUBLICATIONS

International Search Report and Written Opinion of PCT Application No. PCT/JP2021/008044, issued on Jun. 1, 2021, 10 pages of ISRWO.

* cited by examiner

*Primary Examiner* — Ahmed A Berhan
(74) *Attorney, Agent, or Firm* — CHIP LAW GROUP

(57) ABSTRACT

The present disclosure relates to a sensor package, a method of manufacturing the same, and an imaging device that can achieve downsizing and height reduction and suppress occurrence of a flare. A sensor package includes: a solid-state imaging element that generates a pixel signal by photoelectric conversion in accordance with a light amount of incident light; a circuit board electrically connected to the solid-state imaging element; a sensor package substrate that is arranged on an incident light side of the solid-state imaging element and brings the solid-state imaging element into a sealed state; and a lens formed on a lower surface of the sensor package substrate, the lower surface being located (Continued)

on a side of the solid-state imaging element. The present disclosure can be applied to, for example, the imaging device or the like.

18 Claims, 27 Drawing Sheets

(58) Field of Classification Search
CPC .................... G03B 15/02; G03B 15/14; G03B 2205/0046; G03B 2205/0069; G03B 3/02; G03B 30/00; G03B 35/08; G02B 5/208; G02B 7/025; G02B 13/001; G02B 19/0076

See application file for complete search history.

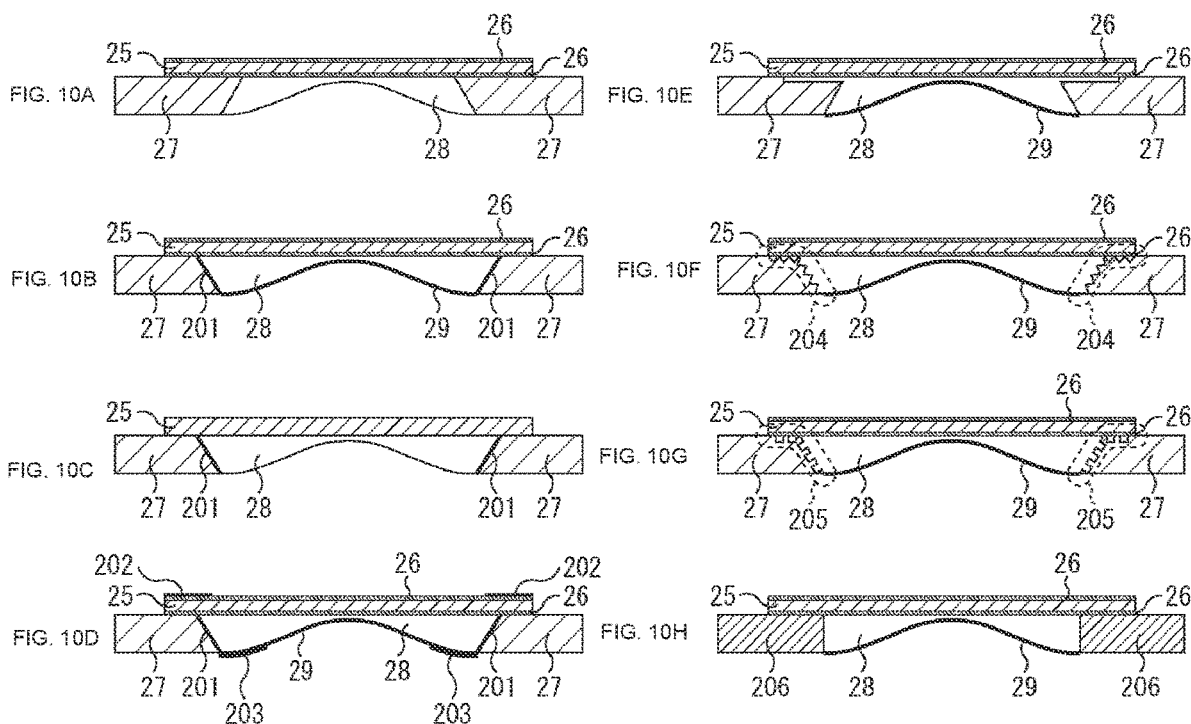

SENSOR PACKAGE, METHOD OF MANUFACTURING THE SAME, AND IMAGING DEVICE

CROSS REFERENCE TO RELATED APPLICATIONS

This application is a U.S. National Phase of International Patent Application No. PCT/JP2021/008044 filed on Mar. 3, 2021, which claims priority benefit of Japanese Patent Application No. JP 2020-046657 filed in the Japan Patent Office on Mar. 17, 2020. Each of the above-referenced applications is hereby incorporated herein by reference in its entirety.

TECHNICAL FIELD

The present disclosure relates to a sensor package, a method of manufacturing the same, and an imaging device, and particularly relates to a sensor package, a method of manufacturing the same, and an imaging device capable of achieving downsizing and height reduction and suppressing occurrence of a flare.

BACKGROUND ART

Recently, an increase in the number of pixels, downsizing, and height reduction have been advanced for a solid-state imaging element used in a camera-equipped mobile terminal device, a digital still camera, and the like.

With an increase in the number of pixels and downsizing of a camera, a lens and the solid-state imaging element are close to each other on an optical axis, so that it is common to arrange an infrared cut filter near the lens.

For example, there is proposed a technology for achieving downsizing of a solid-state imaging element by forming a lowermost lens in a lens group including a plurality of lenses on the solid-state imaging element.

CITATION LIST

Patent Document

Patent Document 1: International Publication No. 2019/235247

SUMMARY OF THE INVENTION

Problems to be Solved by the Invention

However, in a case where the lowermost lens is formed on the solid-state imaging element, this contributes to downsizing and height reduction of a device configuration, but a flare occurs due to total internal reflection of the lowermost lens arranged on the solid-state imaging element.

The present disclosure has been made in view of such circumstances, and an object thereof is to achieve downsizing and height reduction and to suppress occurrence of a flare.

Solutions to Problems

A sensor package according to a first aspect of the present disclosure includes: a solid-state imaging element that generates a pixel signal by photoelectric conversion in accordance with a light amount of incident light; a circuit board electrically connected to the solid-state imaging element; a sensor package substrate that is arranged on an incident light side of the solid-state imaging element and brings the solid-state imaging element into a sealed state; and a lens formed on a lower surface of the sensor package substrate, the lower surface being located on a side of the solid-state imaging element.

A method of manufacturing a sensor package according to a second aspect of the present disclosure includes: filling a predetermined opening with a lens material in a state where a sensor package holding component in which the predetermined opening is formed is fixed to be in contact with a surface on one side of a sensor package substrate; and molding the lens material by a mold of a lens and curing the molded lens material to simultaneously bonding the sensor package substrate, the sensor package holding component, and the lens to each other.

An imaging device according to a third aspect of the present disclosure includes: a sensor package; and a lens unit including a lens group focusing incident light on a light receiving surface of a solid-state imaging element, the sensor package including: the solid-state imaging element that generates a pixel signal by photoelectric conversion in accordance with a light amount of the incident light; a circuit board electrically connected to the solid-state imaging element; a sensor package substrate that is arranged on an incident light side of the solid-state imaging element and brings the solid-state imaging element into a sealed state; and a lens formed on a lower surface of the sensor package substrate, the lower surface being located on a side of the solid-state imaging element.

In the first and third aspects of the present disclosure, provided are: the solid-state imaging element that generates the pixel signal by the photoelectric conversion in accordance with the light amount of the incident light; the circuit board electrically connected to the solid-state imaging element; the sensor package substrate that is arranged on the incident light side of the solid-state imaging element and brings the solid-state imaging element into the sealed state; and the lens formed on the lower surface of the sensor package substrate, the lower surface being located on the side of the solid-state imaging element.

In the second aspect of the present disclosure, the predetermined opening is filled with the lens material in the state in which the sensor package holding component in which the predetermined opening is formed is fixed to be in contact with the surface on one side of the sensor package substrate, and the lens material is molded by the mold of the lens and cured, so that the sensor package substrate, the sensor package holding component, and the lens are simultaneously bonded to each other.

The sensor package and the imaging device may be independent devices or modules built in other devices.

BRIEF DESCRIPTION OF DRAWINGS

FIGS. 10A, 10B, 10C, 10D, 10E, 10F, 10G, and 10H are cross-sectional views illustrating a modified example of a sensor package.

MODE FOR CARRYING OUT THE INVENTION

Figure 1:
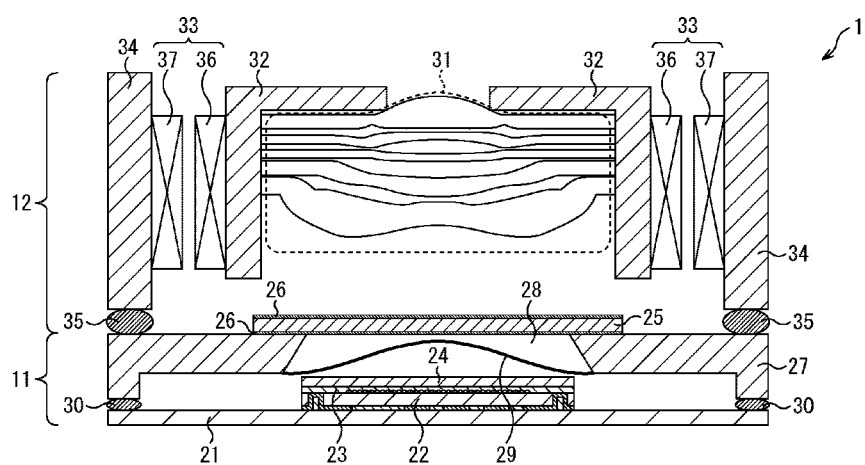
FIG. 1 is a cross-sectional view illustrating a configuration example of an imaging device according to a first embodiment of the present disclosure.

Hereinafter, modes for carrying out the present disclosure (hereinafter referred to as embodiments) will be described. Note that a description will be given in the following order.
1. First Embodiment of Imaging Device
2. Method of Forming Wafer Level Lens
3. Modified Example of Sensor Package
4. Second Embodiment of Imaging Device
5. Third Embodiment of Imaging Device
6. Fourth Embodiment of Imaging Device
7. Fifth Embodiment of Imaging Device
8. Sixth Embodiment of Imaging Device
9. Seventh Embodiment of Imaging Device
10. Example of Application to Electronic Device
11. Use Example of Imaging Device
12. Example of Application to Endoscopic Surgery System
13. Example of Application to Mobile Body Note that the same or similar portions are denoted by the same or similar reference signs in the drawings referred to in the following description. However, the drawings are schematic, and the relationship between the thickness and the plane dimension, the ratio of the thickness of each layer, or the like is different from the actual one. Furthermore, the drawings also include portions having mutually different dimensional relationships and ratios in some cases.

Furthermore, definitions of directions, such as up and down, in the following description are merely definitions for convenience of the description, and do not limit the technical idea of the present disclosure. For example, the up and down are converted into left and right and read when an object rotated by 90° is observed, and the up and down are inverted and read when the object rotated by 180° is observed.

<1. First Embodiment of Imaging Device>

<Configuration Example of Imaging Device>

FIG. 1 is a cross-sectional view illustrating a configuration example of an imaging device according to a first embodiment of the present disclosure, the imaging device configured to be capable of suppressing occurrence of a flare while achieving downsizing and height reduction of the device.

An imaging device 1 in FIG. 1 is a module camera configured by assembling a sensor package 11 and a lens unit 12.

The sensor package 11 includes a solid-state imaging element 22 arranged on a circuit board 21, and the circuit board 21, a sensor package substrate 25, and a sensor package holding component 27 constitute the solid-state imaging element 22 in a sealed state. The sensor package holding component 27 holding the sensor package substrate 25 is fixed to the circuit board 21 by an adhesive 30.

The solid-state imaging element 22 is an imaging sensor including a so-called complementary metal oxide semiconductor (CMOS) sensor, a charge coupled device (CCD), or the like, and is fixed in a state of being electrically connected to the circuit board 21. The solid-state imaging element 22 may be a sensor that receives incident light of a single wavelength such as an infrared ray, or a sensor that receives incident light of multiple wavelengths such as R, G, and B. As will be described later with reference to FIG. 4, the solid-state imaging element 22 includes a plurality of pixels arranged in an array, generates a pixel signal corresponding to a light amount of incident light, which is collected and enters from above in the drawing via the lens group 31, in units of pixels, and outputs the pixel signal to the circuit board 21 as an image signal. The solid-state imaging element 22 may be a sensor that uses a bolometer, a pn diode, a thermopile, a carbon nanotube, or the like.

The solid-state imaging element 22 is a solid-state imaging element having a chip size package (CSP) structure (hereinafter, also referred to as a CSP solid-state imaging element) integrated with a glass substrate 24 by an adhesive 23. A refractive index of the adhesive 23 is substantially the same as that of the glass substrate 24.

The sensor package substrate 25 is arranged on the incident light side of the solid-state imaging element 22 and has a function of an infrared cut filter (IRCF) that cuts infrared light. The sensor package substrate 25 is formed using, for example, a glass-based material such as blue plate glass or a resin-based material, and an antireflection film 26 is formed on an upper surface and a lower surface of the sensor package substrate 25. In a case where the incident light is a far-infrared ray, a metal-based material such as a Si substrate or a Ge substrate can be also used as a material of the sensor package substrate 25.

The sensor package holding component 27 is in contact with the lower surface of the sensor package substrate 25 to fix the sensor package substrate 25, and also holds a lens 28 formed in an opening provided at a position above the solid-state imaging element 22. The sensor package holding component 27 is manufactured, for example, by molding a resin-based material so as to provide the opening at the position above the solid-state imaging element 22.

The lens 28 formed in the opening of the sensor package holding component 27 is a wafer level lens manufactured by a wafer level lens process. The wafer level lens process is a manufacturing method in which a plurality of openings is formed in a planar direction of a wafer substrate, and a mold shape is transferred by pressing a mold against resin dropped on the plurality of openings. An antireflection film 29 is also formed on a lower surface of the lens 28.

The antireflection films 26 and 29 can be configured by alternately stacking a total of four layers of low-refractive films and high-refractive films, for example. The low-refractive film is configured using, for example, an oxide film such as $SiO_x$ ($1 \leq x \leq 2$), SiOC, or SiOF, and the high-refractive film is configured using, for example, a metal oxide film such as TiO, TaO, or $Nb_2O_5$. As another example, each of the antireflection films 26 and 29 may be a single-layer film containing an oxide, a nitride, or other insulating materials, and may be a film containing inorganic matter among them.

On the other hand, the lens unit 12 assembled to the upper side of the sensor package 11 includes the lens group 31 including a plurality of lenses, a lens barrel (lens holder) 32 that houses the lens group 31, an AF drive unit 33, and a fixing unit 34 that fixes the AF drive unit 33. The lens unit 12 is fixed to the sensor package 11 by connecting a lower surface of the fixing unit 34 and an upper surface of the sensor package holding component 27 with an adhesive 35.

The AF drive unit 33 includes an AF coil 36 and an AF magnet 37 that are arranged to face each other. The AF coil 36 is fixed to an outer side wall of the lens barrel 32, and the AF magnet 37 as a permanent magnet is fixed to an inner peripheral side wall of the fixing unit 34. The AF drive unit 33 implements autofocus by moving the lens barrel 32 in the optical-axis direction by causing a current to flow through the AF coil 36 and adjusting a distance between the lens group 31 and the solid-state imaging element 22. Through such an autofocus function of the AF drive unit 33, the lens group 31 focuses the incident light on a light receiving surface of the solid-state imaging element 22.

As described above, the imaging device 1 is configured to suppress the occurrence of the flare while achieving the downsizing and the height reduction of the device configuration by providing the sensor package substrate 25 that cuts (removes) the infrared light and the lens 28 integrally with the sensor package holding component 27.

Note that the antireflection film 26 is formed on the upper surface and the lower surface of the sensor package substrate 25, and the antireflection film 29 is also formed on the lower surface of the lens 28 in FIG. 1, but one or both of the antireflection films 26 and 29 may be omitted. Furthermore, the antireflection film 26 may be formed only on one of the upper surface and the lower surface of the sensor package substrate 25. Furthermore, instead of the antireflection function or in a form of adding functions, a film having another filter function, for example, a filter function such as an infrared cut filter or a band pass filter, may be formed.

<Configuration of CSP Solid-State Imaging Element>

Figure 2:
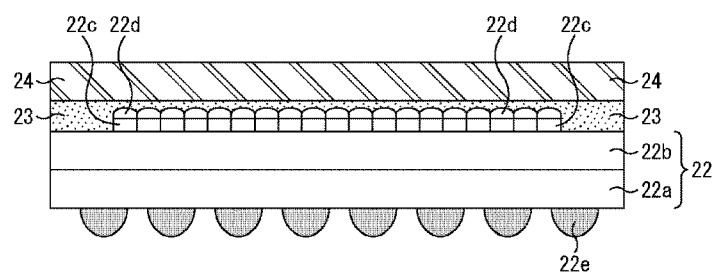
FIG. 2 is a schematic external view of a CSP solid-state imaging element which is a part of the imaging device of FIG. 1.

Next, a configuration of the CSP solid-state imaging element will be described with reference to FIGS. 2, 3A, 3B, 4, 5, and 6. FIG. 2 is a schematic external view of the CSP solid-state imaging element.

The CSP solid-state imaging element illustrated in FIG. 2 is a semiconductor package in which the solid-state imaging element 22 including a laminated substrate, formed by laminating a lower substrate 22a and an upper substrate 22b, is packaged.

On the lower substrate 22a of the laminated substrate forming the solid-state imaging element 22, a plurality of solder balls 22e as back electrodes for an electrical connection with the circuit board 21 of FIG. 1 are formed.

On an upper surface of the upper substrate 22b, color filters 22c of red (R), green (G), or blue (B) and on-chip lenses 22d are formed. Furthermore, the upper substrate 22b is connected to the glass substrate 24, configured to protect the on-chip lenses 22d, with the adhesive 23 formed using a glass seal resin interposed therebetween, thereby forming a cavityless structure.

Figure 3A:
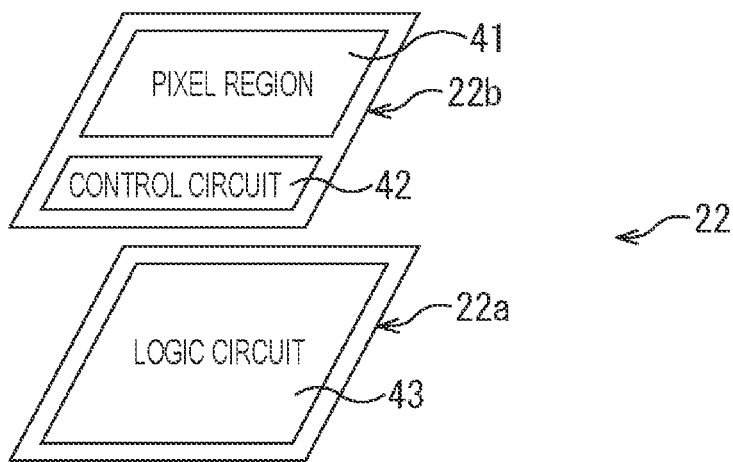
FIGS. 3A and 3B are diagrams illustrating a substrate configuration of the solid-state imaging element.

For example, as illustrated in FIG. 3A, a pixel region 41 in which pixel portions performing photoelectric conversion are two-dimensionally arranged in an array, and a control circuit 42 that controls the pixel portions are formed on the upper substrate 22b, and a logic circuit 43 such as a signal processing circuit that processes a pixel signal output from the pixel portion is formed on the lower substrate 22a.

Figure 3B:
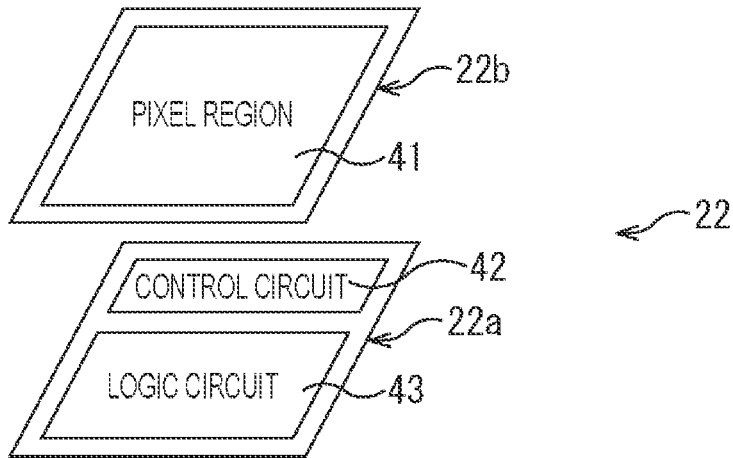

Alternatively, only the pixel region 41 may be formed on the upper substrate 22b, and the control circuit 42 and the logic circuit 43 may be formed on the lower substrate 22a as illustrated in FIG. 3B.

Since the logic circuit 43 or both the control circuit 42 and the logic circuit 43 are formed on the lower substrate 22a different from the upper substrate 22b on which the pixel region 41 is formed, and both the substrates are laminated as described above, a size of the imaging device 1 can be reduced as compared with a case where the pixel region 41, the control circuit 42, and the logic circuit 43 are arranged in the planar direction on one semiconductor substrate.

In the following description, the upper substrate 22b on which at least the pixel region 41 is formed will be referred to as a pixel sensor substrate 22b, and the lower substrate 22a on which at least the logic circuit 43 is formed will be referred to as a logic substrate 22a.

<Configuration Example of Solid-State Imaging Element>

Figure 4:
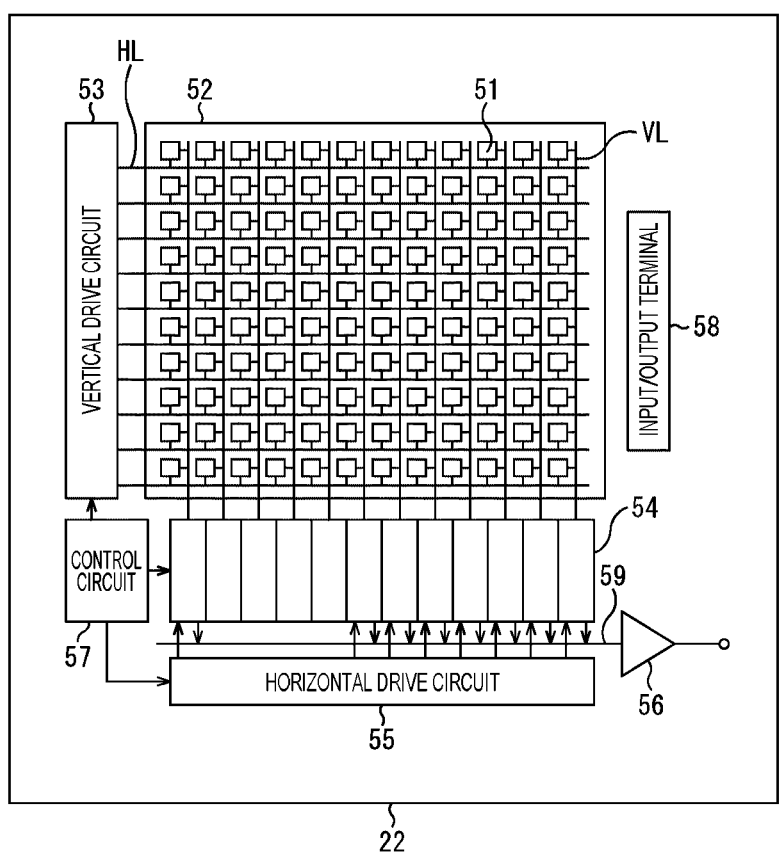
FIG. 4 is a diagram illustrating a circuit configuration example of the solid-state imaging element.

FIG. 4 illustrates a circuit configuration example of the solid-state imaging element 22.

The solid-state imaging element 22 includes a pixel array unit 52 in which pixels 51 are arranged in a two-dimensional array, a vertical drive circuit 53, column signal processing circuits 54, a horizontal drive circuit 55, an output circuit 56, a control circuit 57, and an input/output terminal 58.

The pixel 51 includes a photodiode as a photoelectric conversion element and a plurality of pixel transistors. A circuit configuration example of the pixel 51 will be described later with reference to FIG. 5.

Furthermore, the pixel 51 may have a shared pixel structure. Such a pixel-sharing structure includes a plurality of photodiodes, a plurality of transfer transistors, one shared floating diffusion (floating diffusion region), and other pixel transistors each of which are shared. That is, in the shared pixels, the photodiodes and the transfer transistors constituting a plurality of unit pixels are configured to share the other pixel transistors one by one.

The control circuit 57 receives an input clock and data for instructing an operation mode and the like, and outputs data such as internal information of the solid-state imaging element 22. That is, the control circuit 57 generates a clock signal and a control signal serving as references of operations of the vertical drive circuit 53, the column signal processing circuit 54, the horizontal drive circuit 55, and the like on the basis of a vertical synchronization signal, a horizontal synchronization signal, and a master clock. Then, the control circuit 57 outputs the generated clock signal and control signal to the vertical drive circuit 53, the column signal processing circuit 54, the horizontal drive circuit 55, and the like.

The vertical drive circuit 53 is configured using, for example, a shift register, selects a predetermined pixel drive wiring HL, supplies a pulse for driving the pixels 51 to the selected pixel drive wiring HL, and drives the pixels 51 in units of rows. That is, the vertical drive circuit 53 selectively scans each of the pixels 51 of the pixel array unit 52 sequentially in the vertical direction in units of rows, and supplies a pixel signal based on a signal charge generated in accordance with an amount of received light in a photoelectric conversion unit of each of the pixels 51 to the column signal processing circuit 54 through a vertical signal line VL.

The column signal processing circuit 54 is arranged for each column of the pixels 51, and performs signal processing such as noise removal on the signals output from the pixels 51 of one row for each pixel column. For example, the column signal processing circuit 54 performs signal processing such as correlated double sampling (CDS) and AD conversion to remove fixed pattern noise unique to the pixel.

The horizontal drive circuit 55 is configured using, for example, a shift register, sequentially selects each of the column signal processing circuits 54 by sequentially outputting horizontal scanning pulses, and outputs a pixel signal from each of the column signal processing circuits 54 to a horizontal signal line 59.

The output circuit 56 performs signal processing on the signal sequentially supplied from each of the column signal processing circuits 54 through the horizontal signal line 59, and outputs the processed signals. For example, the output circuit 56 performs only buffering in some cases and performs black level adjustment, column variation correction, various digital signal processing, and the like in other cases. The input/output terminal 58 transmits and receives a signal to and from the outside.

The solid-state imaging element 22 configured as described above is a CMOS image sensor called a column AD system in which the column signal processing circuit 54 that performs CDS processing and AD conversion processing is arranged for each pixel column.

<Circuit Configuration Example of Pixel>

Figure 5:
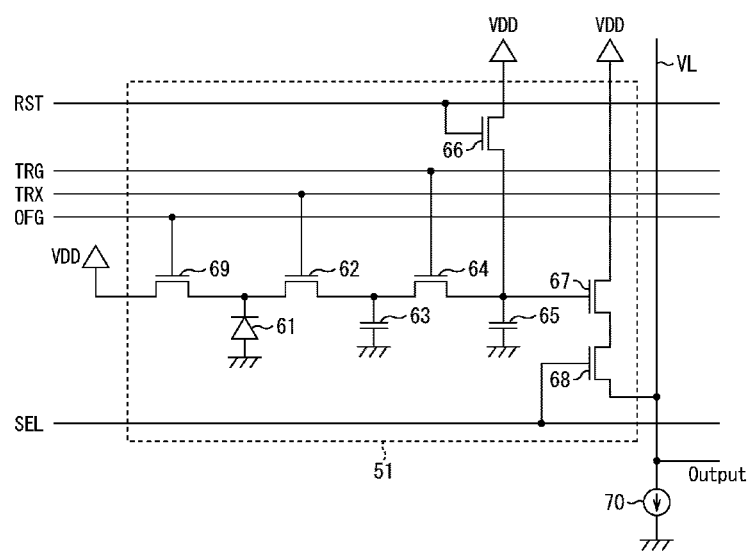
FIG. 5 is a diagram illustrating an equivalent circuit of a pixel.

FIG. 5 illustrates an equivalent circuit of the pixel 51.

The pixel 51 illustrated in FIG. 5 illustrates a configuration that implements an electronic global shutter function.

The pixel 51 includes a photodiode 61 as the photoelectric conversion element, a first transfer transistor 62, a memory unit (MEM) 63, a second transfer transistor 64, a floating diffusion region (FD) 65, a reset transistor 66, an amplification transistor 67, a selection transistor 68, and a discharge transistor 69.

The photodiode 61 is the photoelectric conversion unit that generates and stores the charge (signal charge) in accordance with the amount of received light. The photodiode 61 has an anode terminal that is grounded, and a cathode terminal that is connected to the memory unit 63 via the first transfer transistor 62. Furthermore, the cathode terminal of the photodiode 61 is also connected to the discharge transistor 69 configured to discharge an unnecessary charge.

When turned on by a transfer signal TRX, the first transfer transistor 62 reads the charge generated by the photodiode 61 and transfers the charge to the memory unit 63. The memory unit 63 is a charge holding unit that temporarily holds the charge until the charge is transferred to the FD 65.

When turned on by a transfer signal TRG, the second transfer transistor 64 reads the charge held in the memory unit 63 and transfers the charge to the FD 65.

The FD 65 is a charge holding unit that holds the charge read from the memory unit 63 to read the charge as a signal. When turned on by a reset signal RST, the reset transistor 66 discharges the charge stored in the FD 65 to a constant voltage source VDD to reset a potential of the FD 65.

The amplification transistor 67 outputs a pixel signal in accordance with the potential of the FD 65. That is, the amplification transistor 67 constitutes a source follower circuit with a load MOS 70 serving as a constant current source, and the pixel signal indicating a level according to the charge stored in the FD 65 is output from the amplification transistor 67 to the column signal processing circuit 54 (FIG. 4) via the selection transistor 68. For example, the load MOS 70 is arranged inside the column signal processing circuit 54.

The selection transistor 68 is turned on when the pixel 51 is selected by a selection signal SEL, and outputs the pixel signal of the pixel 51 to the column signal processing circuit 54 via the vertical signal line VL.

When turned on by a discharge signal OFG, the discharge transistor 69 discharges the unnecessary charge stored in the photodiode 61 to the constant voltage source VDD.

The transfer signals TRX and TRG, the reset signal RST, the discharge signal OFG, and the selection signal SEL are supplied from the vertical drive circuit 53 via the pixel drive wiring HL.

The operation of the pixel 51 will be briefly described.

First, the discharge transistors 69 are turned on when the discharge signal OFG at a high level is supplied to the discharge transistors 69 before the start of exposure, the charges stored in the photodiodes 61 are discharged to the constant voltage source VDD, and the photodiodes 61 of all the pixels are reset.

When the discharge transistors 69 are turned off by the discharge signal OFG at a low level after the reset of the photodiodes 61, the exposure starts in all the pixels of the pixel array unit 52.

When a predetermined exposure time set in advance has elapsed, the first transfer transistors 62 are turned on by the transfer signal TRX in all the pixels of the pixel array unit 52, and the charges stored in the photodiodes 61 are transferred to the memory units 63.

After the first transfer transistors 62 are turned off, the charges held in the memory units 63 of the pixels 51 are sequentially read to the column signal processing circuits 54 in units of rows. In the read operation, the second transfer transistors 64 of the pixels 51 in the read row are turned on by the transfer signal TRG, and the charges held in the memory units 63 are transferred to the FDs 65. Then, when the selection transistors 68 are turned on by the selection signal SEL, signals indicating levels according to the charges stored in the FDs 65 are output from the amplification transistors 67 to the column signal processing circuits 54 via the selection transistors 68.

As described above, the pixels 51 each having the pixel circuit in FIG. 5 can operate according to a global shutter system in which the same exposure time is set in all the pixels of the pixel array unit 52, charges are temporarily held in the memory units 63 after the end of the exposure, and the charges are sequentially read from the memory units 63 in units of rows.

Note that the circuit configuration of the pixel 51 is not limited to the configuration illustrated in FIG. 5, and for example, a circuit configuration that does not include the memory unit 63 and performs an operation according to a so-called rolling shutter system can be also adopted.

<Basic Structure Example of Solid-State Imaging Element>

Figure 6:
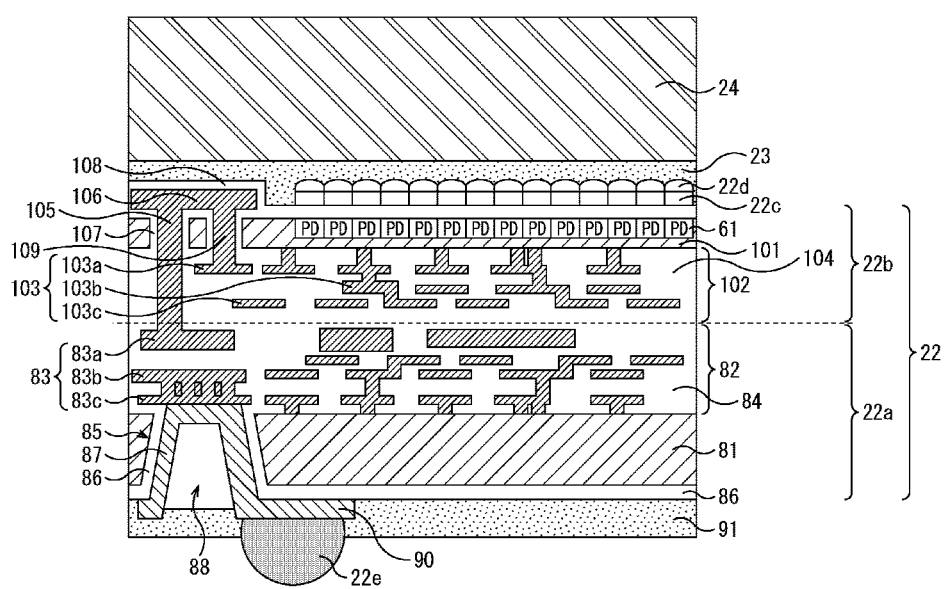
FIG. 6 is a cross-sectional view illustrating a detailed structure of the solid-state imaging element.

Next, a detailed structure of the solid-state imaging element 22 will be described with reference to FIG. 6. FIG. 6 is an enlarged cross-sectional view of a portion of the solid-state imaging element 22.

In the logic substrate 22a, a multilayer wiring layer 82 is formed on an upper side (side of the pixel sensor substrate 22b) of a semiconductor substrate 81 (hereinafter, referred to as a silicon substrate 81) formed using, for example, silicon (Si). The multilayer wiring layer 82 forms the control circuit 42 and the logic circuit 43 in FIGS. 3A and 3B.

The multilayer wiring layer 82 includes: a plurality of wiring layers 83 including an uppermost wiring layer 83a closest to the pixel sensor substrate 22b, an intermediate wiring layer 83b, a lowermost wiring layer 83c closest to the silicon substrate 81, and the like; and interlayer insulating films 84 each of which is formed between the wiring layers 83.

The plurality of wiring layers 83 is formed using, for example, copper (Cu), aluminum (Al), tungsten (W), or the like, and the interlayer insulating film 84 is formed using, for example, a silicon oxide film, a silicon nitride film, or the like. In each of the plurality of wiring layers 83 and the interlayer insulating films 84, the same material may be used in all of the layers or two or more material may be used depending on the layer.

At predetermined positions of the silicon substrate 81, a silicon through-hole 85 penetrating through the silicon substrate 81 is formed and a through-silicon via (TSV) 88 is formed by embedding a connection conductor 87 on an inner wall of the silicon through-hole 85 with an insulating film 86 interposed therebetween. The insulating film 86 can be formed using, for example, a SiO2 film, a SiN film, or the like.

Note that the insulating film 86 and the connection conductor 87 are formed along an inner wall surface of the through-silicon via 88 illustrated in FIG. 6, and the inside of the through-silicon via 85 is hollow, but the entire inside of the silicon through-hole 85 may be also embedded with the connection conductor 87 depending on the inner diameter. In other words, the inside of the through-hole may be embedded with a conductor, or a part thereof may be hollow. That is similarly applied to a through-chip via (TCV) 105 and the like as described later.

The connection conductor 87 of the through-silicon via 88 is connected to a rewiring 90 formed on a side of a lower surface of the silicon substrate 81, and the rewiring 90 is connected to the solder ball 22e. The connection conductor 87 and the rewiring 90 can be formed using, for example, copper (Cu), tungsten (W), tungsten (W), polysilicon, or the like.

Furthermore, on the lower surface side of the silicon substrate 81, a solder mask (solder resist) 91 is formed so as to cover the rewiring 90 and the insulating film 86 except for a region where the solder balls 22e are formed.

On the other hand, in the pixel sensor substrate 22b, a multilayer wiring layer 102 is formed on the lower side (logic substrate 22a side) of a semiconductor substrate 101 (hereinafter, referred to as silicon substrate 101) formed using silicon (Si). The multilayer wiring layer 102 forms a pixel circuit in the pixel region 41 in FIGS. 3A and 3B.

The multilayer wiring layer 102 includes: a plurality of wiring layers 103 including an uppermost wiring layer 103a closest to the silicon substrate 101, an intermediate wiring layer 103b, a lowermost wiring layer 103c closest to the logic substrate 22a, and the like; and interlayer insulating films 104 each of which is formed between the wiring layers 103.

The same kinds of materials of the wiring layer 83 and the interlayer insulating film 84 described above can be adopted as materials used for the plurality of wiring layers 103 and the interlayer insulating films 104. Furthermore, the plurality of wiring layers 103 and the interlayer insulating films 104 may be formed using one material or two or more materials, which is similar to the wiring layer 83 and the interlayer insulating film 84 described above.

Note that the multilayer wiring layer 102 of the pixel sensor substrate 22b includes three layers of the wiring layers 103 and the multilayer wiring layer 82 of the logic substrate 22a includes four layers of the wiring layers 83 in the example of FIG. 6, but the total number of wiring layers is not limited thereto, and any number of layers can be formed.

In the silicon substrate 101, the photodiode 61 formed by a PN junction is formed for each of the pixels 51.

Furthermore, the plurality of pixel transistors, such as the first transfer transistors 62 and the second transfer transistors 64, the memory units (MEMs) 63, and the like are also formed in the multilayer wiring layer 102 and the silicon substrate 101 although not illustrated.

A through-silicon via 109 connected to the wiring layer 103a of the pixel sensor substrate 22b and the through-chip via 105 connected to the wiring layer 83a of the logic substrate 22a are formed at predetermined positions of the silicon substrate 101 where the color filter 22c and the on-chip lens 22d are not formed.

The through-chip via 105 and the through-silicon via 109 are connected by a connection wiring 106 formed on an upper surface of the silicon substrate 101. Furthermore, an insulating film 107 is formed between the silicon substrate 101 and each of the through-silicon via 109 and the through-chip via 105. Moreover, the color filter 22c and the on-chip lens 22d are formed on the upper surface of the silicon substrate 101 with a planarization film (insulating film) 108 interposed therebetween.

As described above, the solid-state imaging element 22 illustrated in FIG. 2 has the laminated structure in which the side of the multilayer wiring layer 102 of the logic substrate 22a and the side of the multilayer wiring layer 82 of the pixel sensor substrate 22b are pasted to each other. In FIG. 6, a pasted surface between the side of the multilayer wiring layer 102 of the logic substrate 22a and the side of the multilayer wiring layer 82 of the pixel sensor substrate 22b is indicated by a broken line.

Furthermore, in the solid-state imaging element 22 of the imaging device 1, the wiring layer 103 of the pixel sensor substrate 22b and the wiring layer 83 of the logic substrate 22a are connected by two through electrodes, that is, the through-silicon via 109 and the through-chip via 105, and the wiring layer 83 of the logic substrate 22a and the solder ball (back electrode) 22e are connected to the through-silicon via 88 and the rewiring 90. Therefore, the plane area of the imaging device 1 can be reduced to the utmost minimum.

Moreover, the solid-state imaging element 22 and the glass substrate 24 are pasted to each other by the adhesive 23 to form the cavityless structure, so that reduction in the height direction can be also achieved.

Therefore, the semiconductor device (semiconductor package) that is further downsized can be achieved according to the imaging device 1 illustrated in FIG. 1.

As described with reference to FIG. 1, the imaging device 1 is configured such that the solid-state imaging element 22 is sealed by the circuit board 21, the sensor package substrate 25, and the sensor package holding component 27.

In such a sealed state, it is necessary to increase a distance in the optical-axis direction between the sensor package substrate 25 and the solid-state imaging element 22 to a certain extent in order to suppress the influence of a stain caused by dust generated in the AF drive unit 33.

Figure 7:
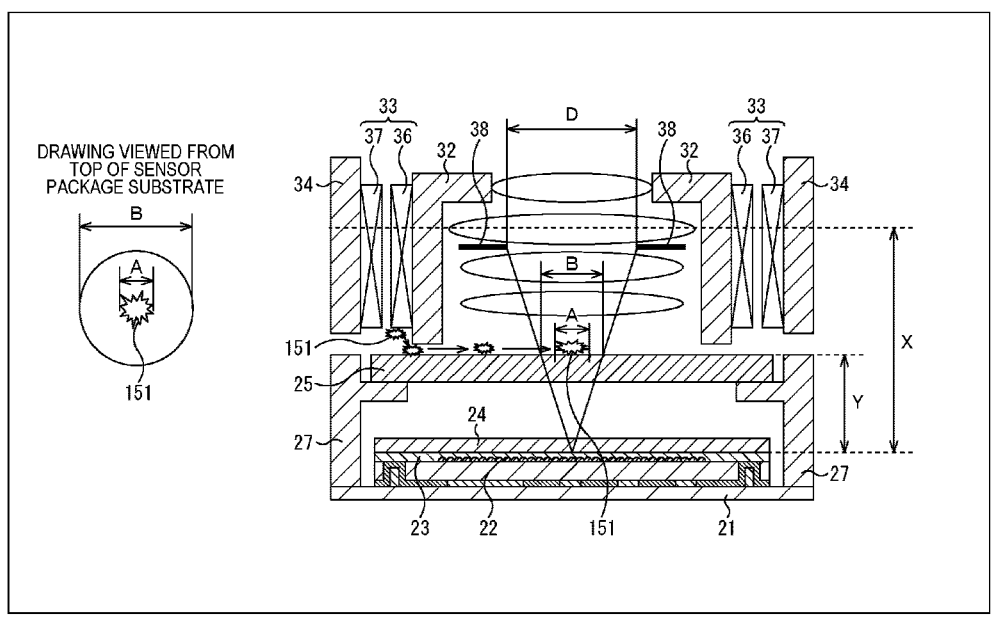
FIG. 7 is a view for describing a distance between a sensor package substrate and the solid-state imaging element based on a viewpoint of a stain caused by dust.

The distance between the sensor package substrate 25 and the solid-state imaging element 22 will be considered on the basis of a viewpoint of the stain caused by the dust generated in the AF drive unit 33 with reference to FIG. 7.

As illustrated in FIG. 7, when the lens barrel 32 is driven by the AF drive unit 33, dust 151 is generated in the AF drive unit 33, and reaches an optical path of incident light on the sensor package substrate 25, which causes the stain and a fault. If the distance between the sensor package substrate 25 and the solid-state imaging element 22 is increased, the stain is not generated even in a case where a size of the dust 151 is large. From the viewpoint of the stain, it is better to set the distance between the sensor package substrate 25 and the solid-state imaging element 22 to be large, but in such a case, the device size increases. Thus, there is a trade-off relationship between downsizing and height reduction.

Therefore, it is necessary to calculate a minimum required distance between the sensor package substrate 25 and the solid-state imaging element 22 from the viewpoint of the stain caused by the dust.

Here, a focal length of the imaging device 1 is denoted by X, a distance from a focal point to the upper surface of the sensor package substrate 25 is denoted by Y, a lens effective aperture of the lens group 31 is denoted by D, an allowable diameter of the dust 151 is denoted by A, and a diameter of incident light on the sensor package substrate 25 is denoted by B as illustrated in FIG. 7. Note that an aperture stop 38 is omitted in FIG. 1, but the lens effective aperture D of the lens group 31 is determined by a size of the aperture stop 38.

For example, assuming that the size of the dust 151 assumed to be circular is 2% or less with respect to the area of the incident light on the sensor package substrate 25 as a standard at the time of shipment, the diameter B of the incident light on the sensor package substrate 25 can be expressed as follows using the diameter A of the dust 151.

$$0.02 \times (B/2)^2 \times \pi = (A/2)^2 \times \pi$$

$$B = \sqrt{(A^2/0.02)}$$

Then, a relationship between the diameter B of the incident light on the sensor package substrate 25 and the lens effective aperture D corresponds a distance between the focal length X and the distance Y from the focal point to the upper surface of the sensor package substrate 25. Thus, the distance Y from the focal point to the upper surface of the sensor package substrate 25 can be expressed by the following formula using the focal length X, the diameter A of the dust 151, and the lens effective aperture D.

$$B:D=Y:X$$

$$\sqrt{(A^2/0.02)}:D=Y:X$$

$$Y=(X \times \sqrt{(A^2/0.02)})/D$$

Therefore, in order to restrict the size of the dust 151 to be 2% or less with respect to the area of the incident light on the sensor package substrate 25, it is necessary to design the distance Y from the focal point to the upper surface of the sensor package substrate 25 such that $Y > \{(X \times \sqrt{(A^2/0.02)})/D\}$.

For example, assuming that A=23 μm, D=2.2 mm, and X=4.4 mm, $Y > \{(X \times \sqrt{(A^2/0.02)})/D\} = 0.325$, and the distance Y from the focal point to the upper surface of the sensor package substrate 25 needs to be set to be 0.325 mm or more.

Since it is necessary to secure the distance Y from the focal point to the upper surface of the sensor package substrate 25 to a certain extent from the viewpoint of the stain caused by the dust as described above, and thus, a predetermined space is generated between the sensor package substrate 25 and the solid-state imaging element 22 as illustrated in FIG. 7.

Figure 8A:
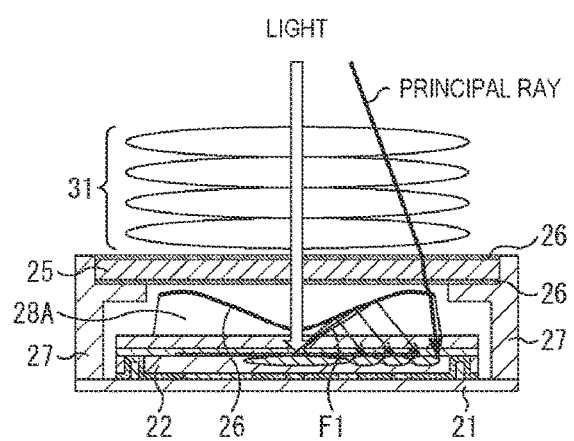
FIGS. 8A and 8B are views illustrating an effect of the imaging device in FIG. 1.
Figure 8B:
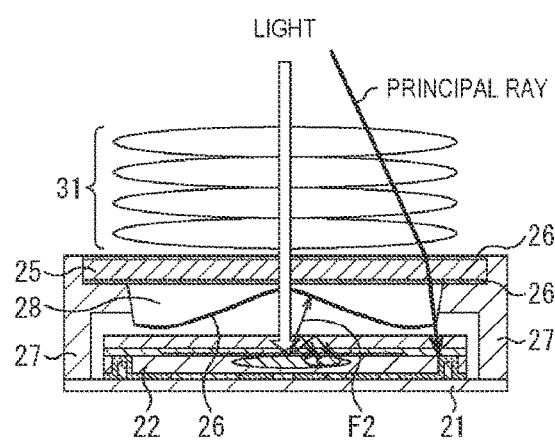

Therefore, optical characteristics can be improved by utilizing the space generated between the sensor package substrate 25 and the solid-state imaging element 22 and arranging the wafer level lens in this empty space to provide lens power as illustrated in FIGS. 8A and 8B.

As a method of arranging the wafer level lens in the space between the sensor package substrate 25 and the solid-state imaging element 22, a method of forming a lens 28A on the glass substrate 24 integrated with the solid-state imaging element 22 as illustrated in FIG. 8A and a method of forming the lens 28 on the lower surface of the sensor package substrate 25 as illustrated in FIG. 8B are considered.

A structure in which the lens 28 is formed on the lower surface of the sensor package substrate 25 as illustrated in FIG. 8B is a structure adopted in the imaging device 1 of FIG. 1. On the other hand, a structure illustrated in FIG. 8A in which the lens 28A is formed on the glass substrate 24 is a structure of an imaging device as a comparative example compared with the imaging device 1 of FIG. 1. In FIGS. 8A and 8B, structures other than the arrangement of the lens 28 and the lens 28A are the same, and the lens group 31 is simplified.

In camera optics, it is known that a decrease in sensitivity occurs since a principal ray is obliquely incident as proceeding from the center to an edge of an image plane. This is referred to as shading. In camera optics, it is known that a decrease in sensitivity occurs since a principal ray is obliquely incident as proceeding from the center to an edge of an image plane. This is referred to as shading. When the lens 28A or the lens 28 corresponding to 0.5 piece (single-sided lens) is formed in the empty space between the sensor package substrate 25 and the solid-state imaging element 22 to provide the lens power, it is possible to change the oblique incidence of the principal ray to be close to a perpendicular incidence angle and improve shading characteristics. The lens 28A and the lens 28 become aspherical concave lenses since it is necessary to correct a field curvature.

In a case where the lens 28A is formed on the glass substrate 24 as in FIG. 8A, reflection light F1 of the incident light reflected by the surface of the solid-state imaging element 22 is incident on the surface of the lens 28A at a large incident angle as illustrated in FIG. 8A, and thus, is totally and internally reflected by the surface of the lens 28A, and becomes a ring flare.

On the other hand, in a case where the lens 28 is formed on the lower surface of the sensor package substrate 25 as in FIG. 8B, reflection light F2 of the incident light reflected by the surface of the solid-state imaging element 22 is incident at a small incident angle substantially perpendicular to the surface of the lens 28 through an air layer as illustrated in FIG. 8B, and thus, a total internal reflection condition is not satisfied, and the total internal reflection does not occur on the surface of the lens 28. Therefore, the occurrence of the ring flare can be suppressed. Furthermore, the reflection light F2 reflected by the surface of the solid-state imaging element 22 can be also suppressed by the antireflection film 26 formed on the surface of the lens 28.

According to the imaging device 1 of FIG. 1 in which the lens 28 is arranged on the lower surface of the sensor package substrate 25 in the space between the sensor package substrate 25 and the solid-state imaging element 22 as described above, it is possible to achieve the downsizing and the height reduction and to suppress the occurrence of the flare. In other words, it is possible to suppress the flare occurring on the lens 28A while maintaining the optical characteristics as in FIG. 8A with the configuration of the lens 28.

Note that the method of forming the lens 28 will be described later with reference to FIGS. 9A, 9B, 9C, and 9D. In a case where a fault occurs in the process of forming the lens 28 (wafer level lens process), a yield of the lens 28A becomes a yield of the CSP solid-state imaging element in the method of arranging the lens 28A on the glass substrate 24 as in FIG. 8A.

On the other hand, a yield of the lens 28 becomes a yield of the sensor package substrate 25 in the method of arranging the lens 28 on the lower surface of the sensor package substrate 25 as in FIG. 8B. When cost of the sensor package substrate 25 and cost of the CSP solid-state imaging element are compared in units of components, the sensor package substrate 25 is cheaper, and thus, it is possible to suppress a loss when the fault of the lens 28 occurs.

<2. Method of Forming Wafer Level Lens>

Next, a lens formation method of forming the lens 28, which is the wafer level lens, on the sensor package holding component 27 will be described with reference to FIGS. 9A, 9B, 9C, and 9D.

Note that the lens formation method of forming one lens 28 will be described in FIGS. 9A, 9B, 9C, and 9D, but this is similarly applied to the wafer level lens process in which a plurality of the lenses 28 is simultaneously formed in the planar direction of the sensor package holding component 27.

Figure 9A:
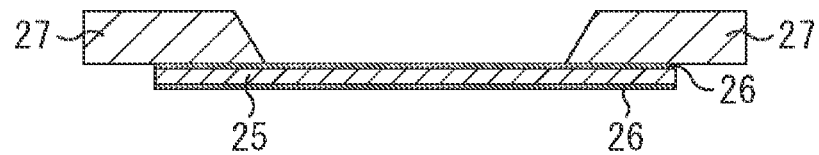
FIGS. 9A, 9B, 9C, and 9D are views illustrating a method of forming a wafer level lens.

As illustrated in FIG. 9A, the sensor package substrate 25 in which the antireflection film 26 is formed on both the upper surface and the lower surface is prepared first, and the sensor package holding component 27 in which a predetermined opening is formed is fixed to be in contact with one surface of the sensor package substrate 25.

Figure 9B:
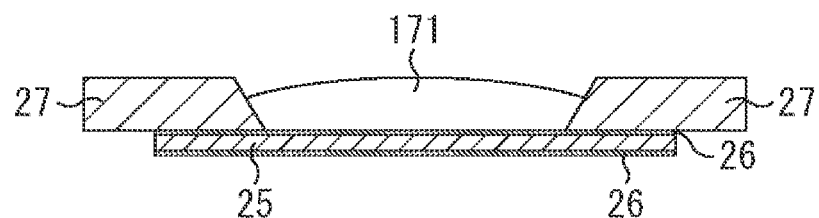

Next, a lens material 171 is dropped (charged) into the opening of the sensor package holding component 27 as illustrated in FIG. 9B. A dropping position of the lens material 171 can be controlled with high accuracy using an alignment mark formed at a predetermined position of the sensor package holding component 27 as a reference. As the lens material 171, for example, a resin material that is cured by ultraviolet rays is used.

Note that a thermosetting or thermoplastic resin material or a glass-based material can be used as the lens material 171 instead of the ultraviolet-curable resin material Furthermore, in a case where a wavelength of light detected as the incident light is in an infrared region or the like, a metal-based material may be used.

Figure 9C:
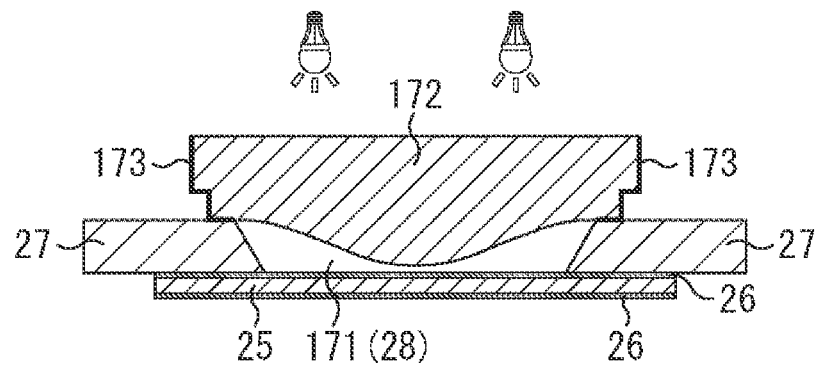

Next, a mold 172 having a concavo-convex shape of the lens 28 and attached to an imprinting device is pressed against the sensor package holding component 27 at a predetermined speed with a predetermined load as illustrated in FIG. 9C. Therefore, the concavo-convex shape of the mold 172 is transferred to the lens material 171 dropped into the opening of the sensor package holding component 27. At this time, the mold 172 abuts on the sensor package holding component 27, so that a distance (height) between the mold 172 and the sensor package holding component 27 is controlled with high accuracy. Similarly to the dropping position of the lens material 171, a position of the mold 172 in the planar direction is controlled with high accuracy using an alignment mark formed at a predetermined position on the sensor package holding component 27 as a reference. A surface of the mold 172 in contact with the lens material 171 may be subjected to a mold release treatment in advance such that the mold 172 is easily peeled off from the cured lens material 171.

Then, the mold 172 is irradiated with ultraviolet rays from above in a state where the mold 172 is pressed against the lens material 171, so that the lens material 171 is cured, thereby forming the lens 28. A light shielding film (mask) 173 that does not transmit the ultraviolet rays is formed on an outer peripheral portion of the mold 172 in the planar direction, and the lens material 171 protruding from the mold 172 is not irradiated with ultraviolet rays. Therefore, the lens material 171 outside the mold 172 can be removed without being cured. The mold 172 is peeled off after the lens material 171 is cured and the lens 28 is formed.

Figure 9D:
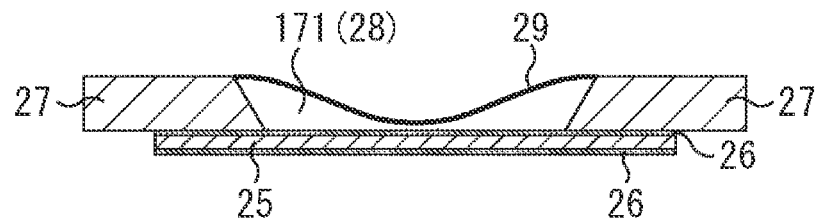

Then, the antireflection film 29 is formed on the surface of the lens 28 from which the mold 172 has been peeled off as illustrated in FIG. 9D.

When the lens 28 is formed as described above, the sensor package substrate 25 and the sensor package holding component 27 can be simultaneously bonded at the time of forming the lens 28, and thus, the sensor package substrate 25, the sensor package holding component 27, and the lens 28 can be bonded through a one-time bonding (attachment) process.

<3. Modified Example of Sensor Package>

FIGS. 10A, 10B, 10C, 10D, 10E, 10F, 10G, and 10H, illustrate other structure examples of the sensor package 11 having a structure in which the sensor package substrate 25, the sensor package holding component 27, and the lens 28 can be simultaneously bonded by one-time bonding process as described in FIGS. 9A, 9B, 9C, and 9D.

In the description of FIGS. 10A, 10B, 10C, 10D, 10E, 10F, 10G, and 10H, a description regarding portions common to the imaging device 1 according to the first embodiment of FIG. 1 will be appropriately omitted, and portions different from those of the imaging device 1 of FIG. 1 will be described in comparison with the imaging device 1 of FIG. 1.

Note that only peripheral portions of the sensor package substrate 25 and the lens 28 are illustrated in FIGS. 10A, 10B, 10C, 10D, 10E, 10F, 10G, and 10H, and other configurations (for example, the circuit board 21, the solid-state imaging element 22, and the outer peripheral side of the sensor package holding component 27) are omitted.

In FIGS. 10A, 10B, 10C, 10D, 10E, 10F, 10G, and 10H, FIG. 10A illustrates a modified example of the sensor package 11.

The first modified example in FIG. 10A illustrates an example in which the antireflection film 29 formed on the surface of the lens 28 on the lower side, which is the side of the solid-state imaging element 22, in the imaging device 1 of FIG. 1 is omitted. As in this example, the antireflection film 29 formed on the surface of the lens 28 can be omitted.

In FIGS. 10A, 10B, 10C, 10D, 10E, 10F, 10G, and 10H, FIG. 10B illustrates a second modified example of the sensor package 11.

In the imaging device 1 of FIG. 1, a side surface of the opening of the sensor package holding component 27 is formed to be inclined such that the opening is wider on the side of the solid-state imaging element 22. On the other hand, in the second modified example in FIG. 10B, a side surface of an opening of the sensor package holding component 27 is formed to be inclined such that the opening is wider on the side of the sensor package substrate 25. Therefore, incident light hits a side surface of the lens 28, so that the light shielding film 201 is formed on the side surface of the lens 28.

In FIGS. 10A, 10B, 10C, 10D, 10E, 10F, 10G, and 10H, FIG. 10C illustrates a third modified example of the sensor package 11.

The third modified example in FIG. 10C illustrates an example in which the antireflection films 26 formed on the upper surface and the lower surface of the sensor package substrate 25 in the imaging device 1 of FIG. 1 are omitted, and the antireflection film 29 formed on the surface of the lens 28 is also omitted. As in this example, the antireflection film 26 and the antireflection film 29 can be omitted, and in particular, the antireflection film 26 on the lower surface of the sensor package substrate 25 can be omitted the most.

In FIGS. 10A, 10B, 10C, 10D, 10E, 10F, 10G, and 10H, FIG. 10D illustrates a fourth modified example of the sensor package 11.

The fourth modified example in FIG. 10D has a configuration in which light shielding films 202 and 203 are added to the second modified example in FIG. 10B. The light shielding film 202 is formed on an outer peripheral portion of the upper surface of the sensor package substrate 25. The light shielding film 203 is formed on the antireflection film 29 formed on the surface of the lens 28 and on an outer peripheral portion of the lens 28. Since the light shielding films 202 and 203 are formed, it is possible to prevent unnecessary incident light from entering a light receiving surface of the solid-state imaging element 22. Note that only one of the light shielding films 202 and 203 may be formed.

In FIGS. 10A, 10B, 10C, 10D, 10E, 10F, 10G, and 10H, FIG. 10E illustrates a fifth modified example of the sensor package 11.

The fifth modified example in FIG. 10E has a configuration in which a part of a contact surface of the sensor package holding component 27 that is in contact with the sensor package substrate 25 is dug, and a material of the lens 28 is inserted into such a dug space to enlarge both of a contact surface between the lens 28 and the sensor package substrate 25 and a contact surface between the sensor package holding component 27 and the lens 28. Since the contact surfaces among the lens 28, the sensor package substrate 25, and the sensor package holding component 27 are enlarged, fixation can be strengthened.

In FIGS. 10A, 10B, 10C, 10D, 10E, 10F, 10G, and 10H, FIG. 10F illustrates a sixth modified example of the sensor package 11.

In the sixth modified example of FIG. 10E, an uneven portion 204 in which chevron-shaped (triangular pyramidal) protrusions are formed at regular intervals is formed on a contact surface between the sensor package holding component 27 and the sensor package substrate 25 and a contact surface between the sensor package holding component 27 and the lens 28.

In FIGS. 10A, 10B, 10C, 10D, 10E, 10F, 10G, and 10H, FIG. 10G illustrates a seventh modified example of the sensor package 11.

In the seventh modified example in FIG. 10G, an uneven portion 205 in which recesses each of which is dug perpendicularly to the surface are formed at a constant cycle is formed on a contact surface between the sensor package holding component 27 and the sensor package substrate 25 and a contact surface between the sensor package holding component 27 and the lens 28.

In both the sixth modified example in FIG. 10E and the seventh modified example in FIG. 10G, a side surface of an opening of the sensor package holding component 27 is formed to be inclined such that the opening is wider on the side of the sensor package substrate 25, it is necessary to prevent reflection of incident light. The uneven portions 204 and 205 are types of an antireflection structure that prevents the reflection of incident light. Furthermore, fixation between the lens 28 and the sensor package holding component 27 can be strengthened by inserting a material of the lens 28 into the uneven portions 204 and 205.

The uneven structure formed on the contact surface between the sensor package holding component 27 and the sensor package substrate 25 and the contact surface between the sensor package holding component 27 and the lens 28 may be another moth-eye structure other than the uneven portion 204 that is a repetition of the chevron shape and the uneven portion 205 that is a repetition of the recess.

In FIGS. 10A, 10B, 10C, 10D, 10E, 10F, 10G, and 10H, FIG. 10H illustrates an eighth modified example of the sensor package 11.

In the eighth modified example in FIG. 10H, the sensor package holding component 27 in the imaging device 1 of FIG. 1 is formed using a ceramic or organic circuit board 206. An opening of the circuit board 206 has the same size on the side of the solid-state imaging element 22 and the side of the sensor package substrate 25.

FIGS. 11A, 11B, 11C, and 11D illustrate a plan views of the sensor package holding component 27 in which the lens 28 is formed.

Figure 11A:
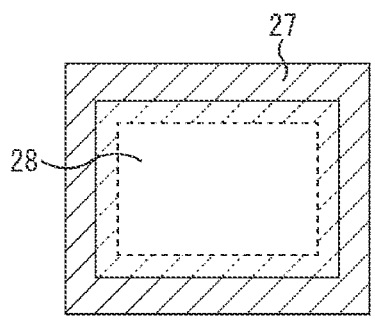
FIGS. 11A, 11B, 11C, and 11D are plan views of a sensor package holding component.
Figure 11B:
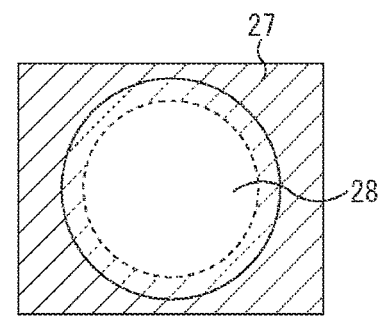

Planar shapes of the opening of the sensor package holding component 27 and the lens 28 can be a quadrangle as illustrated in FIG. 11A, or can be a circle as illustrated in FIG. 11B. Alternatively, the planar shapes of the opening of the sensor package holding component 27 and the lens 28 may be elliptical. In FIGS. 11A and 11B, a solid line of an outer frame of the lens 28 represents an outer periphery of the lens 28 on the same plane as the upper surface of the sensor package holding component 27, and a broken line of an inner frame of the lens 28 represents an outer periphery of the lens 28 on the same plane as the lower surface of the sensor package holding component 27.

Figure 11C:
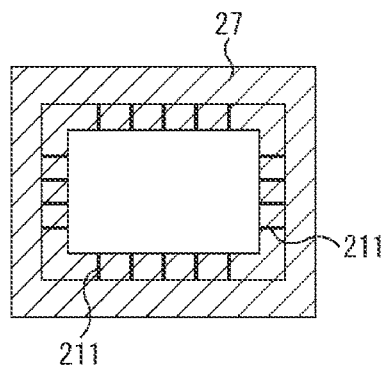
Figure 11D:
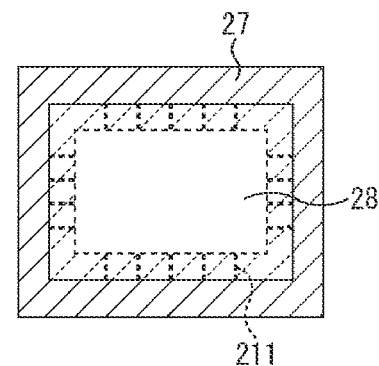

Furthermore, in a case where the material of the lens 28 is also arranged on the contact surface on the upper side where the sensor package holding component 27 is in contact with the sensor package substrate 25 as in the fifth modified example illustrated in FIG. 10E, a plurality of recessed grooves 211 can be provided in the vicinity of the opening of the upper surface of the sensor package holding component 27 on the side of the sensor package substrate 25 as illustrated in FIG. 11C. Since the plurality of grooves 211 are provided on the upper surface of the sensor package holding component 27 on the side of the sensor package substrate 25, the material of the lens 28 penetrates into the grooves 211, and fixation between the lens 28 and the sensor package holding component 27 is strengthened. FIG. 11D, illustrates a plan view of a state in which the lens 28 is formed in the sensor package holding component 27 provided with the plurality of grooves 211.

Figure 12:
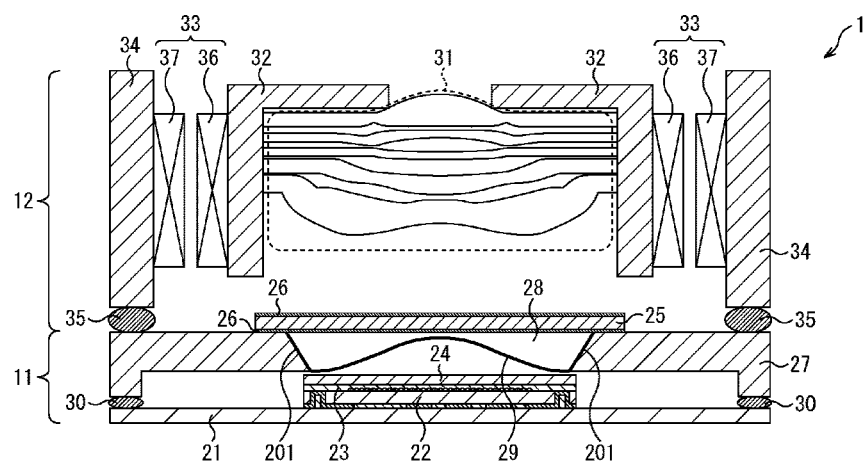
FIG. 12 is a cross-sectional view of an imaging device using a sensor package according to a second modified example.

FIG. 12 is a cross-sectional view of the entire imaging device 1 using the sensor package 11 according to the second modified example illustrated in FIG. 10B. Similarly, the imaging device 1 is configured by replacing a part of the sensor package 11 in each of the modified examples of FIGS. 10A, 10C, 10D, 10E, 10F, and 10G.

Figure 13:
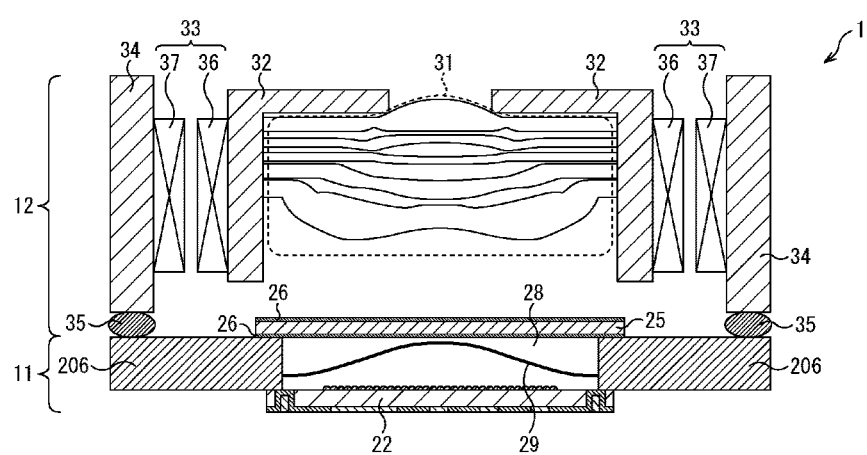
FIG. 13 is a cross-sectional view of an imaging device using a sensor package according to an eighth modified example.

FIG. 13 is a cross-sectional view of the entire imaging device 1 using the sensor package 11 according to the eighth modified example illustrated in FIG. 10H.

In a case where the sensor package holding component 27 is formed using the ceramic or organic circuit board 206 as in the eighth modified example, the circuit board 21 arranged on the lower side of the solid-state imaging element 22 can be omitted as illustrated in FIG. 13. Furthermore, the adhesive 23 and the glass substrate 24 formed on the upper surface of the solid-state imaging element 22 are also omitted in FIG. 13.

Each of the modified examples of the first embodiment described above also has a configuration in which the lens 28 is arranged on the lower surface of the sensor package substrate 25 in the space between the sensor package substrate 25 and the solid-state imaging element 22, and thus, it is possible to achieve downsizing and height reduction and to suppress occurrence of a flare as described with reference to FIGS. 8A and 8B.

<4. Second Embodiment of Imaging Device>

Figure 14:
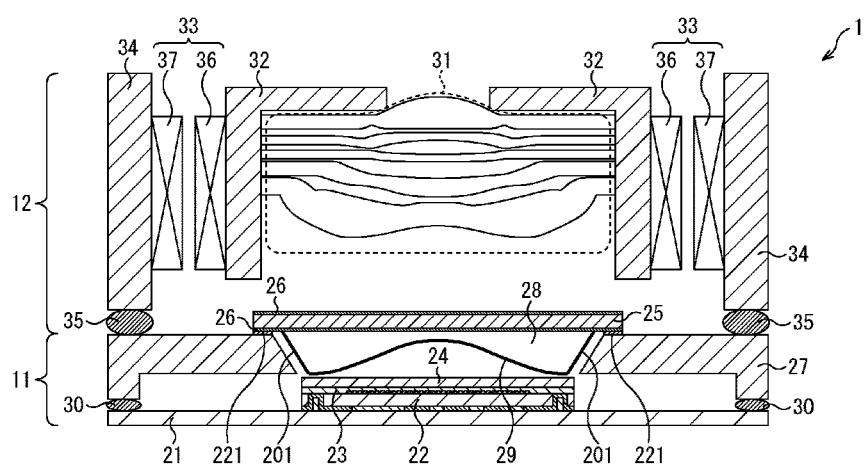
FIG. 14 is a cross-sectional view illustrating a configuration example of an imaging device according to a second embodiment of the present disclosure.

FIG. 14 is a cross-sectional view illustrating a configuration example of an imaging device according to a second embodiment of the present disclosure.

In the second embodiment of FIG. 14, portions corresponding to those of the above-described first embodiment and the modified examples thereof are denoted by the same reference signs, and the description of the portions will be appropriately omitted. This is similarly applied to other embodiments to be described in FIG. 15 and subsequent drawings.

The second embodiment of FIG. 14 is the same as the imaging device 1 according to the second modified example illustrated in FIG. 12 (FIG. 10B) in that a side surface of an opening of the sensor package holding component 27 is formed to be inclined such that the opening is wider on the side of the sensor package substrate 25, and the light shielding film 201 is formed on a side surface of the lens 28.

Meanwhile, the side surface of the lens 28 on which the light shielding film 201 is formed is in contact with the side surface of the opening of the sensor package holding component 27 in the imaging device 1 according to the second modified example illustrated in FIG. 12, but the side surface of the lens 28 and the side surface of the opening of the sensor package holding component 27 are separated by a predetermined distance to form a space between the lens 28 and the sensor package holding component 27 in the second embodiment of FIG. 14.

In the second embodiment, a lower surface of the sensor package substrate 25 including the antireflection film 26 and an upper surface of the sensor package holding component 27 are fixed with an adhesive 221 instead of bonding the lens 28 and the sensor package holding component 27 to each other.

Such configurations of the sensor package substrate 25, the sensor package holding component 27, and the lens 28 are not formed by the simultaneous bonding described in FIGS. 9A, 9B, 9C, and 9D, but by first forming the lens 28 on the sensor package substrate 25 through a wafer level lens process, and attaching the sensor package substrate 25 on which the lens 28 is formed to the sensor package holding component 27 with the adhesive 221.

The second embodiment described above also has a configuration in which the lens 28 is arranged on the lower surface of the sensor package substrate 25 in a space between the sensor package substrate 25 and the solid-state imaging element 22, and thus, it is possible to achieve downsizing and height reduction and to suppress occurrence of a flare as described with reference to FIGS. 8A and 8B.

<5. Third Embodiment of Imaging Device>

Figure 15:
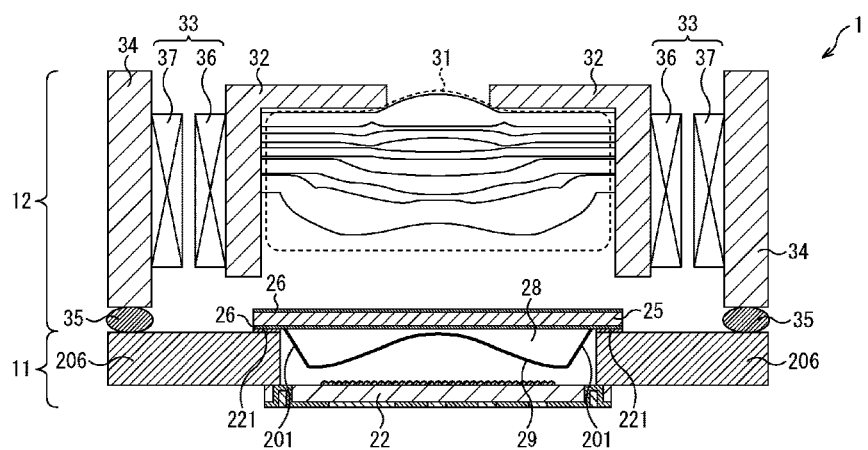
FIG. 15 is a cross-sectional view illustrating a configuration example of an imaging device according to a third embodiment of the present disclosure.

FIG. 15 is a cross-sectional view illustrating a configuration example of an imaging device according to a third embodiment of the present disclosure.

The third embodiment of FIG. 15 has a configuration obtained by further modifying the imaging device 1 according to the eighth modified example illustrated in FIG. 13 (FIG. 10H).

In the imaging device 1 according to the eighth modified example illustrated in FIG. 13 (FIG. 10H), the side surface of the lens 28 is bonded to the ceramic or organic circuit board 206, and a planar size of the lens 28 is the same on the side of the solid-state imaging element 22 and the side of the sensor package substrate 25.

Meanwhile, a side surface of the lens 28 and a side surface of an opening of the circuit board 206 are separated by a predetermined distance to form a space between the lens 28 and the circuit board 206 in the third embodiment of FIG. 15. The side surface of the lens 28 is inclined to be wider on the side of the sensor package substrate 25, and the light shielding film 201 is formed on the side surface of the lens 28. Then, a lower surface of the sensor package substrate 25 including the antireflection film 26 and an upper surface of the circuit board 206 are fixed with the adhesive 221.

Such configurations of the sensor package substrate 25, the circuit board 206, and the lens 28 are formed by first forming the lens 28 on the sensor package substrate 25 through a wafer level lens process, and attaching the sensor package substrate 25 on which the lens 28 is formed to the circuit board 206 with the adhesive 221 similarly to the second embodiment described in FIG. 14.

The third embodiment described above also has a configuration in which the lens 28 is arranged on the lower surface of the sensor package substrate 25 in a space between the sensor package substrate 25 and the solid-state imaging element 22, and thus, it is possible to achieve downsizing and height reduction and to suppress occurrence of a flare as described with reference to FIGS. 8A and 8B.

<6. Fourth Embodiment of Imaging Device>

Figure 16:
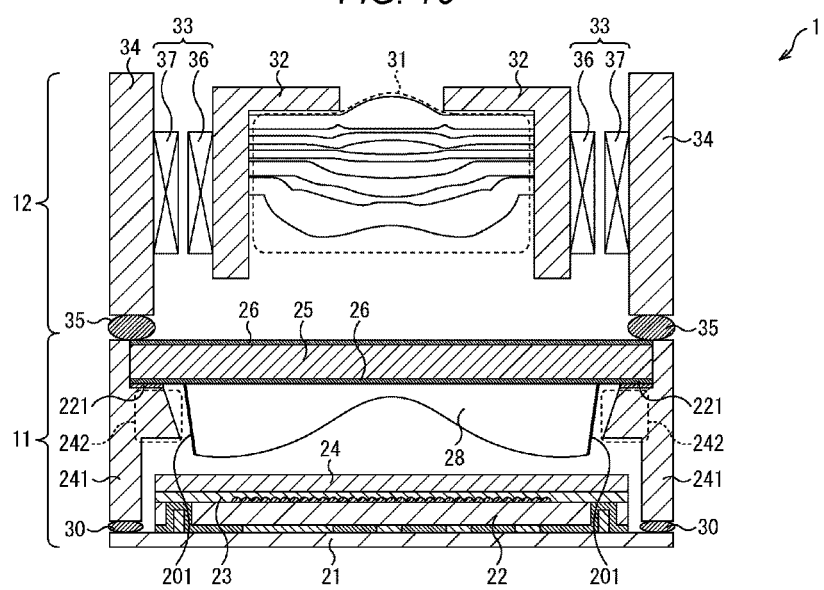
FIG. 16 is a cross-sectional view illustrating a configuration example of an imaging device according to a fourth embodiment of the present disclosure.

FIG. 16 is a cross-sectional view illustrating a configuration example of an imaging device according to a fourth embodiment of the present disclosure.

When the fourth embodiment of FIG. 16 is compared with the first embodiment illustrated in FIG. 1, the sensor package holding component 27 is replaced with a sensor package holding component 241. Assuming that a device size of the lens unit 12 on the upper side is the same between FIGS. 1 and 16, the imaging device 1 of FIG. 16 is configured to have a larger chip size of the solid-state imaging element 22 of the sensor package 11 on the lower side as compared with that in the first embodiment illustrated in FIG. 1.

The sensor package holding component 241 has a protrusion 242 protruding to the inner side where the solid-state imaging element 22 is arranged in a cross-sectional view, and a lower surface of the sensor package substrate 25 including the antireflection film 26 and an upper surface of the protrusion 242 of the sensor package holding component 241 are fixed with the adhesive 221. The sensor package substrate 25 is in contact with the sensor package holding component 241 on the lower surface and a side surface.

The sensor package holding component 241 is formed such that a side surface of the protrusion 242 is inclined to be wider on the side of the sensor package substrate 25, and a side surface of the lens 28 and the side surface of the protrusion 242 of the sensor package holding component 241 are separated by a predetermined distance to form a space between the lens 28 and the protrusion 242 of the sensor package holding component 241.

Although the antireflection film 29 formed on the lower surface of the lens 28 in the second embodiment of FIG. 14 is omitted in the example of FIG. 16, the antireflection film 29 may be formed.

Figure 17A:
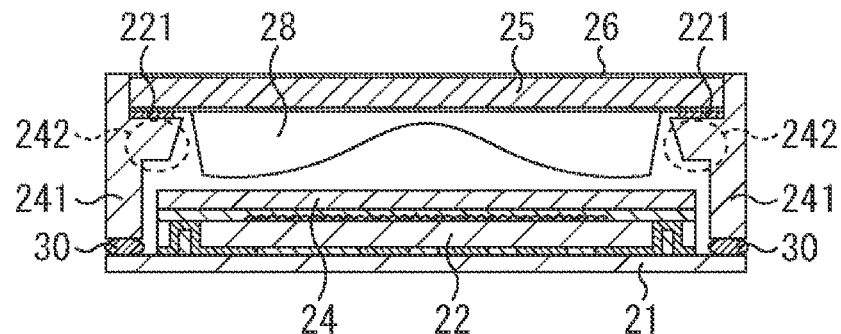
FIGS. 17A, 17B, and 17C are cross-sectional views illustrating a modified example of the fourth embodiment.
Figure 17B:
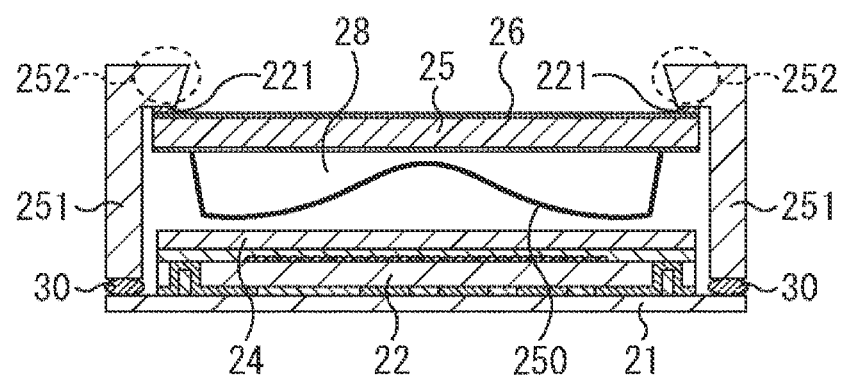
Figure 17C:
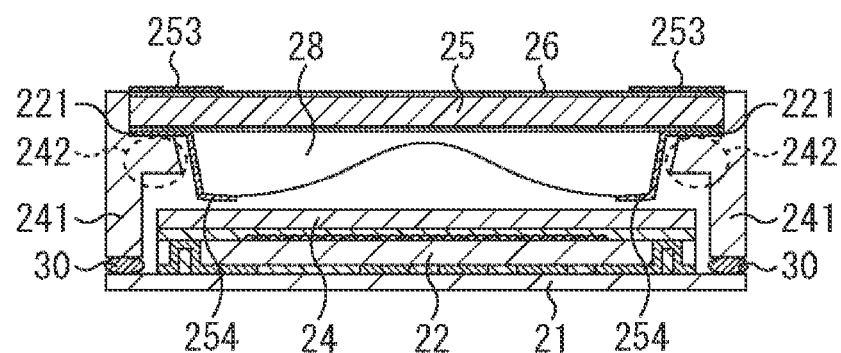

FIGS. 17A, 17B, and 17C illustrate modified examples of the fourth embodiment illustrated in FIG. 16, and illustrates other examples of the sensor package 11. Note that the lens unit 12 is similar to that in FIG. 16, and thus, is omitted.

In FIGS. 17A, 17B, and 17C, FIG. 17A is a cross-sectional view of the sensor package 11 illustrating a first modified example of the fourth embodiment.

The sensor package 11 in FIG. 17A is different from that of the fourth embodiment in FIG. 16 in that a side surface of the protrusion 242 of the sensor package holding component 241 is inclined to be wider on the side of the solid-state imaging element 22 instead of the side of the sensor package substrate 25. Other configurations are similar to those of the fourth embodiment in FIG. 16.

In FIGS. 17A, 17B, and 17C, FIG. 17B is a cross-sectional view of a sensor package 11 illustrating a second modified example of the fourth embodiment.

In the sensor package 11 in FIG. 17B, the sensor package holding component 241 in FIG. 16 is replaced with a sensor package holding component 251. The sensor package holding component 251 includes a protrusion 252 in the uppermost portion, the protrusion 252 protruding to the inner side where the solid-state imaging element 22 is arranged, and a lower surface of the protrusion 252 is in contact with an upper surface of the sensor package substrate 25 including the antireflection film 26 to fix the sensor package substrate 25 with the adhesive 221. An antireflection film 250 is formed on a lower surface and a side surface of the lens 28.

In FIGS. 17A, 17B, and 17C, FIG. 17C is a cross-sectional view of a sensor package 11 illustrating a third modified example of the fourth embodiment.

The sensor package 11 in FIG. 17C is different from that of the fourth embodiment in FIG. 16 in that a light shielding film 253 is formed on an outer peripheral portion of an upper surface of the sensor package substrate 25 including the antireflection film 26, and an antireflection film 254 is further additionally formed on an outer peripheral portion of a lower surface of a sensor package substrate 25 and a part (outer peripheral portion) and a side surface of a lower surface of the lens 28. Other configurations are similar to those of the fourth embodiment in FIG. 16.

The above-described fourth embodiment and the modified examples thereof also have a configuration in which the lens 28 is arranged on the lower surface of the sensor package substrate 25 in a space between the sensor package substrate 25 and the solid-state imaging element 22, and thus, it is possible to achieve downsizing and height reduction and to suppress occurrence of a flare as described with reference to FIGS. 8A and 9B.

<7. Fifth Embodiment of Imaging Device>

Figure 18:
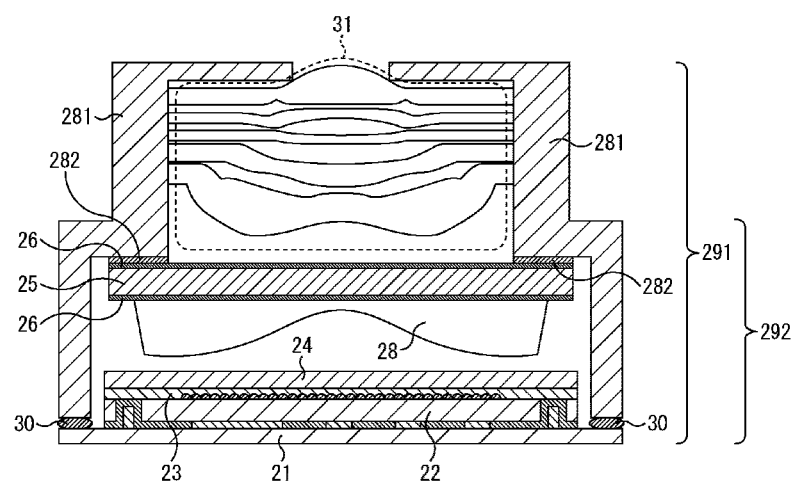
FIG. 18 is a cross-sectional view illustrating a configuration example of an imaging device according to a fifth embodiment of the present disclosure.

FIG. 18 is a cross-sectional view illustrating a configuration example of an imaging device according to a fifth embodiment of the present disclosure.

In the first to fourth embodiments described above, the imaging device 1 has the configuration in which the lens unit 12 includes the AF drive unit 33 that moves the lens barrel 32 in the optical-axis direction.

The imaging device 1 according to the fifth embodiment of FIG. 18 has a fixed focus configuration in which the lens unit 12 is fixed.

In the fifth embodiment of FIG. 18, a lens barrel 281 in which functions of the lens barrel (lens holder) 32, the fixing unit 34, and the sensor package holding component 27 in the first embodiment of FIG. 1 are integrated is provided.

The lens barrel 281 accommodates the lens group 31 including a plurality of lenses, and is fixed to the circuit board 21 with the adhesive 30. Furthermore, the lens barrel 281 is connected to an upper surface of the sensor package substrate 25 including the antireflection film 26 with an adhesive 282 to fix the sensor package substrate 25. The lens 28 is formed on a lower surface (surface on the side of the solid-state imaging element 22) of the sensor package substrate 25. Although not illustrated in FIG. 18, the antireflection film 29 or the light shielding film 201 illustrated in FIG. 15 may be formed on the surface of the lens 28.

In such a fixed focus imaging device 1, all the devices fixed by the lens barrel 281 constitute the lens unit 291, and the sensor package substrate 25 including the antireflection film 26 to the circuit board 21 on the lower side of the lens group 31 (on the side of the solid-state imaging element 22) constitute a sensor package functional unit 292 corresponding to the sensor package 11 in FIG. 1.

The fifth embodiment described above also has a configuration in which the lens 28 is arranged on the lower surface of the sensor package substrate 25 in a space between the sensor package substrate 25 and the solid-state imaging element 22, and thus, it is possible to achieve downsizing and height reduction and to suppress occurrence of a flare as described with reference to FIGS. 8A and 8B.

Note that, in the fixed focus configuration in which the lens unit 12 is fixed, a structure of the lens barrel 281 is not limited to a structure illustrated in FIG. 18, and may be another structure as long as the lens 28 is arranged on the lower surface of the sensor package substrate 25 in the space between the sensor package substrate 25 and the solid-state imaging element 22.

<8. Sixth Embodiment of Imaging Device>

Figure 19:
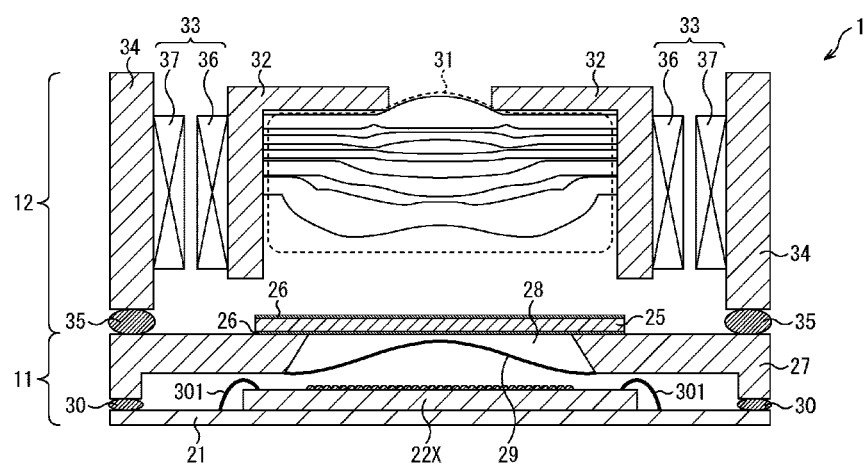
FIG. 19 is a cross-sectional view illustrating a configuration example of an imaging device according to a sixth embodiment of the present disclosure.

FIG. 19 is a cross-sectional view illustrating a configuration example of an imaging device according to a sixth embodiment of the present disclosure.

In the first to fifth embodiments described above, the solid-state imaging element 22 has the CSP structure, and transmits and receives a pixel signal, power, and the like to and from the circuit board 21 through the solder balls 22e at the back of the solid-state imaging element 22.

However, the CSP structure requires pasting with the glass substrate 24, wiring of an input/output terminal of the solid-state imaging element 22 on the back side of a light receiving surface, and the like, and thus, processing becomes complicated.

Therefore, it is also possible to adopt a chip-on-board (COB) structure in which the solid-state imaging element 22 has an input/output terminal (electrode) provided on the same surface as a light receiving surface and is electrically connected to the circuit board 21 using a bonding wire to transmit and receive a pixel signal, power, and the like.

The sixth embodiment of FIG. 19 has a configuration in which the imaging device 1 according to the first embodiment of FIG. 1 adopting the CSP structure is modified to have the COB structure that uses the bonding wire.

In the sixth embodiment of FIG. 19, the solid-state imaging element 22, the adhesive 23, and the glass substrate 24 in FIG. 1 are changed to a solid-state imaging element 22X. The solid-state imaging element 22X is electrically connected to the circuit board 21 by a bonding wire 301, and transmits and receives a pixel signal, power, and the like through the bonding wire 301.

The COB structure that makes the electrical connection with the circuit board 21 using the bonding wire 301 can be also applied to the fixed focus imaging device 1 that is illustrated in FIG. 18 as the fifth embodiment.

Figure 20:
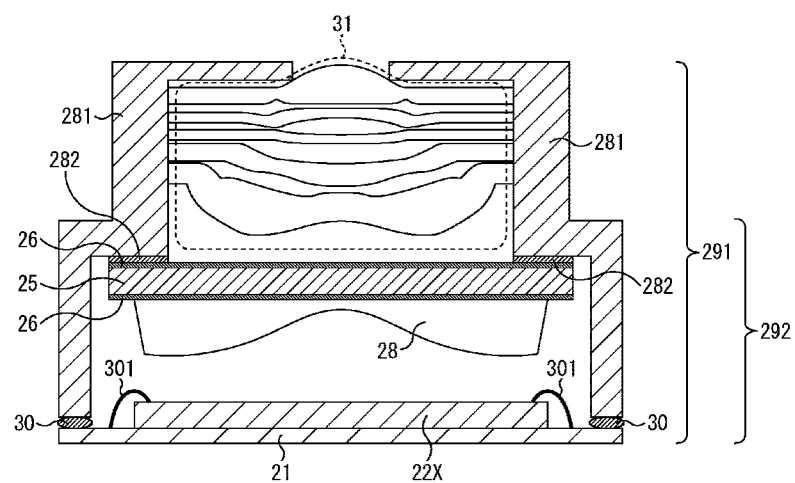
FIG. 20 is a cross-sectional view illustrating a modified example of the sixth embodiment of the present disclosure.

FIG. 20 is a modified example of the sixth embodiment, and illustrates a configuration example in which the solid-state imaging element 22 of the fixed focus imaging device 1 illustrated in FIG. 18 is modified to the solid-state imaging element 22X that has the COB structure and uses bonding wire 301 similarly to that of FIG. 19.

FIG. 20 illustrates an example in which an on-chip lens of the solid-state imaging element 22X is omitted, but there may be both of a case where the on-chip lens is formed and a case where the on-chip lens is not formed.

The sixth embodiment described above also has a configuration in which the lens 28 is arranged on the lower surface of the sensor package substrate 25 in a space between the sensor package substrate 25 and the solid-state imaging element 22X, and thus, it is possible to achieve downsizing and height reduction and to suppress occurrence of a flare as described with reference to FIGS. 8A and 8B.

The connection with the circuit board 21 can be facilitated by using the solid-state imaging element 22X having the COB structure, and thus, it is possible to simplify processing and to reduce cost.

<9. Seventh Embodiment of Imaging Device>

Figure 21:
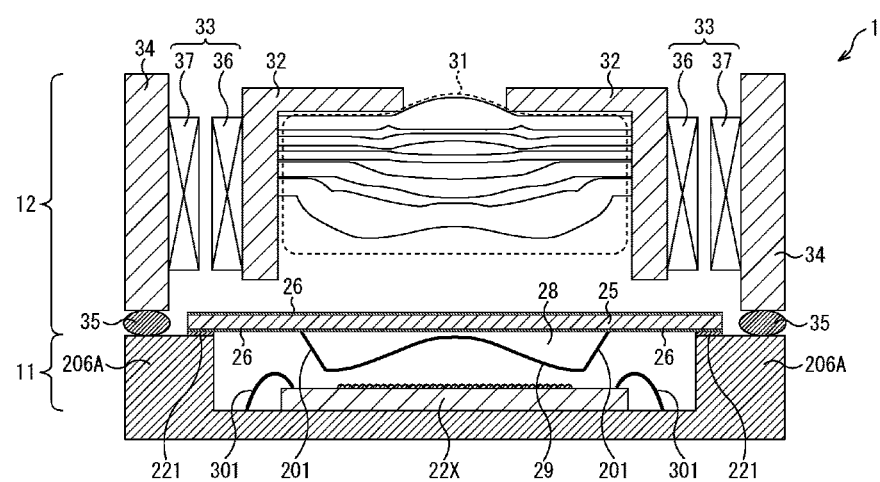
FIG. 21 is a cross-sectional view illustrating a configuration example of an imaging device according to a seventh embodiment of the present disclosure.

FIG. 21 is a cross-sectional view illustrating a configuration example of an imaging device according to a seventh embodiment of the present disclosure.

In the third embodiment illustrated in FIG. 15, the sensor package holding component 27 is formed using the ceramic or organic circuit board 206, and the sensor package substrate 25 is fixed to the circuit board 206 on the lower surface of the sensor package substrate 25 with the adhesive 221. Furthermore, the circuit board 206 is in contact with the upper surface of the solid-state imaging element 22 to fix the solid-state imaging element 22.

On the other hand, in the seventh embodiment of FIG. 21, the circuit board 206 in FIG. 15 is changed to a circuit board 206A having a cavity structure. The circuit board 206A having the cavity structure has an opening at a position above the solid-state imaging element 22X, and a size of the opening is larger than a size of the solid-state imaging element 22X. The solid-state imaging element 22X has the COB structure, and is electrically connected to the circuit board 206A using the bonding wire 301. The circuit board 206A fixes a lower surface of the sensor package substrate 25 with the adhesive 221.

In this manner, the circuit board 206A having the cavity structure can be also configured as the sensor package holding component 27.

The seventh embodiment described above also has a configuration in which the lens 28 is arranged on the lower surface of the sensor package substrate 25 in a space between the sensor package substrate 25 and the solid-state imaging element 22X, and thus, it is possible to achieve downsizing and height reduction and to suppress occurrence of a flare as described with reference to FIGS. 8A and 8B.

Note that the example of FIG. 21 is an example in which the solid-state imaging element 22X having the COB structure is used as a solid-state imaging element arranged on the circuit board 206A having the cavity structure, but it goes without saying that the solid-state imaging element 22 having the CSP structure may be used.

<10. Example of Application to Electronic Device>

The imaging device 1 described above can be applied to various electronic devices, for example, an imaging device such as a digital still camera or a digital video camera, a mobile phone having an imaging function, or other devices having the imaging function.

Figure 22:
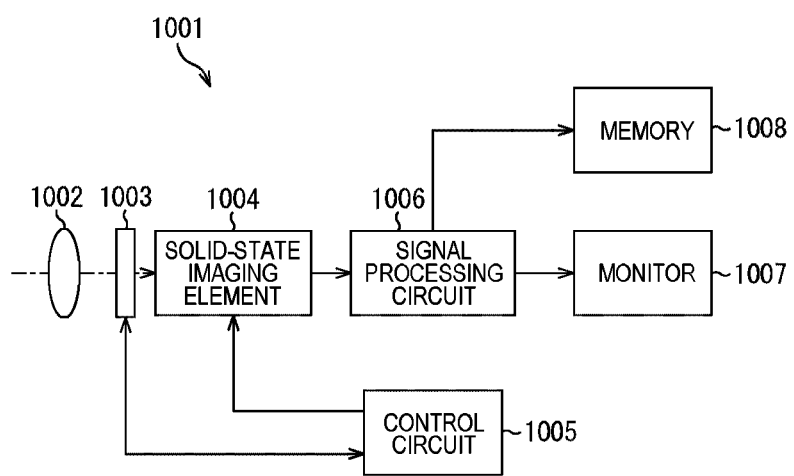
FIG. 22 is a block diagram illustrating a configuration example of an imaging device as an electronic device to which a technology of the present disclosure is applied.

FIG. 22 is a block diagram illustrating a configuration example of an imaging device as an electronic device to which the present disclosure is applied.

An imaging device 1001 illustrated in FIG. 22 includes an optical system 1002, a shutter device 1003, a solid-state imaging element 1004, a drive circuit 1005, a signal processing circuit 1006, a monitor 1007, and a memory 1008, and can capture a still image and a moving image.

The optical system 1002 includes one or a plurality of lenses and guides light (incident light) from a subject to the solid-state imaging element 1004 to form an image on a light receiving surface of the solid-state imaging element 1004.

The shutter device 1003 is arranged between the optical system 1002 and the solid-state imaging element 1004, and controls a light irradiation period and a light shielding period with respect to the solid-state imaging element 1004 under the control of the drive circuit 1005.

The solid-state imaging element 1004 is configured using a package including the above-described solid-state imaging element. The solid-state imaging element 1004 stores signal charges for a certain period according to light formed as an image on the light receiving surface through the optical system 1002 and the shutter device 1003. The signal charge stored in the solid-state imaging element 1004 is transferred in accordance with a drive signal (timing signal) supplied from the drive circuit 1005.

The drive circuit 1005 outputs the drive signal for controlling a transfer operation of the solid-state imaging element 1004 and a shutter operation of the shutter device 1003 to drive the solid-state imaging element 1004 and the shutter device 1003.

The signal processing circuit 1006 performs various types of signal processing on the signal charge output from the solid-state imaging element 1004. An image (image data) obtained by performing the signal processing by the signal processing circuit 1006 is supplied to and displayed on the monitor 1007, or supplied to and stored (recorded) in the memory 1008.

In the imaging device 1001 configured as described above, it is also possible to achieve downsizing and height reduction, and to suppress occurrence of a flare by applying the imaging device 1 according to each of the embodiments in FIG. 1 and the like, instead of the optical system 1002 and the solid-state imaging element 1004 described above.

<11. Use Examples of Imaging Device>

Figure 23:
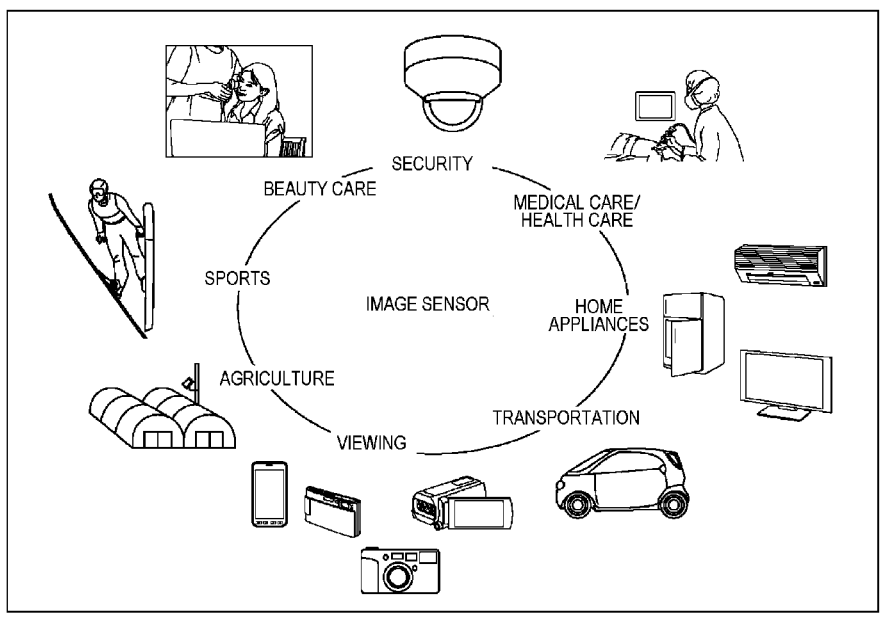
FIG. 23 is a view illustrating use examples of the imaging device to which the technology of the present disclosure is applied.

FIG. 23 is a diagram illustrating use examples in which the above-described imaging device 1 is used.

The above-described imaging device 1 can be used, for example, in various cases of sensing light such as visible light, infrared light, ultraviolet light, and X-rays as follows.

A device that captures an image for use in viewing, such as a digital camera or a portable device equipped with a camera function A device used in transportation, such as a vehicle-mounted sensor that captures images of a front, a rear, surroundings, an interior, and the like of a vehicle, a monitoring camera that monitors traveling vehicles and roads, or a range-finding sensor that measures a distance between vehicles and the like, for safety driving such as automatic stop, recognition of a state of a driver state, and the like A device used for home appliances such as a TV, a refrigerator, and an air conditioner, to capture an image of a gesture of a user and operate such an appliance in accordance with the gesture A device used for medical care and health care, such as an endoscope or a device that performs angiography by receiving infrared light A device used for security, such as a monitoring camera for a crime prevention application or a camera for a person authentication application A device used for beauty care, such as a skin measuring instrument that captures an image of a skin or a microscope that captures an image of a scalp A device used for sports, such as an action camera or a wearable camera for sports applications and the like A device used for agriculture, such as a camera for monitoring states of fields and crops <12. Example of Application to Endoscopic Surgery System>

The technology according to the present disclosure (present technology) can be applied to various products. For example, the technology according to the present disclosure may be applied to an endoscopic surgery system.

Figure 24:
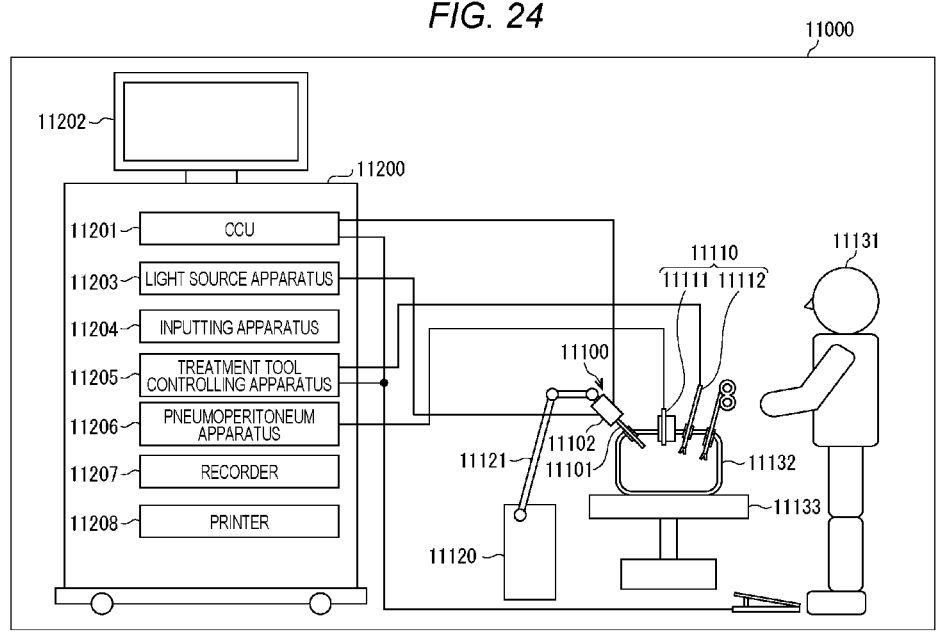
FIG. 24 is a view illustrating an example of a schematic configuration of an endoscopic surgery system.

FIG. 24 is a view illustrating an example of a schematic configuration of an endoscopic surgery system to which the technology according to an embodiment of the present disclosure (present technology) can be applied.

In FIG. 24, a state is illustrated in which a surgeon (medical doctor) 11131 is using an endoscopic surgery system 11000 to perform surgery for a patient 11132 on a patient bed 11133. As illustrated in the drawing, the endoscopic surgery system 11000 includes an endoscope 11100, other surgical tools 11110 such as a pneumoperitoneum tube 11111 and an energy device 11112, a supporting arm device 11120 which supports the endoscope 11100 thereon, and a cart 11200 on which various devices for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example illustrated, the endoscope 11100 is illustrated which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. Note that that the endoscope 11100 may be a forward-viewing endoscope or may be an oblique-viewing endoscope or a side-viewing endoscope.

An optical system and an imaging element are provided in the inside of the camera head 11102 such that reflection light (observation light) from the observation target is condensed on the imaging element by the optical system. The observation light is photo-electrically converted by the imaging element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Moreover, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light at the time of capturing an image of a surgical region to the endoscope 11100.

An inputting apparatus 11204 is an input interface for the endoscopic surgery system 11000. A user can input various kinds of information or instructions to the endoscopic surgery system 11000 through the inputting apparatus 11204. For example, the user inputs an instruction or a like to change an imaging condition (a type of irradiation light, a magnification, a focal length, or the like) by the endoscope 11100.

A treatment tool controlling apparatus 11205 controls driving of the energy device 11112 for cautery or incision of a tissue, sealing of a blood vessel, or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is a device capable of recording various kinds of information relating to surgery. A printer 11208 is a device capable of printing various kinds of information relating to surgery in various forms such as a text, an image, or a graph.

Note that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a captured image can be performed by the light source apparatus 11203. Furthermore, in this case, it is also possible to capture an image corresponding to each of RGB time-divisionally by irradiating an observation target with laser light from each of the RGB laser light sources in a time-divisionally and controlling driving of the imaging elements of the camera head 11102 in synchronization with an irradiation timing. According to this method, a color image can be obtained even if color filters are not provided for the imaging element.

Furthermore, the light source apparatus 11203 may be controlled such that the intensity of light to be outputted is changed for each predetermined time. By controlling driving of the imaging element of the camera head 11102 in synchronism with the timing of the change of the intensity of light to acquire images time-divisionally and synthesizing the images, an image of a high dynamic range free from underexposed blocked up shadows and overexposed highlights can be created.

Furthermore, the light source apparatus 11203 may be configured to supply light of a predetermined wavelength band ready for special light observation. In the special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in the special light observation, fluorescent observation for obtaining an image from fluorescent light generated by irradiation of excitation light may be performed. In the fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 25:
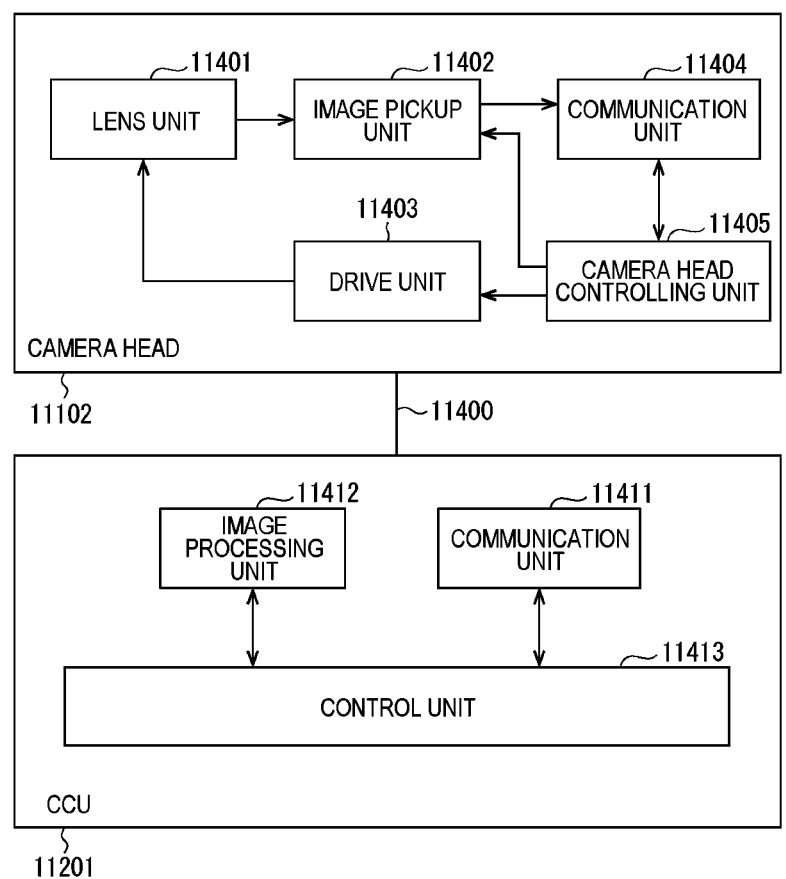
FIG. 25 is a block diagram illustrating exemplary functional configurations of a camera head and a camera control unit (CCU).

FIG. 25 is a block diagram illustrating exemplary functional configurations of the camera head 11102 and the CCU 11201 illustrated in FIG. 24.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected to be capable of bi-directional communication via a transmission cable 11400.

The lens unit 11401 is an optical system, provided at a connection portion with the lens barrel 11101. Observation light taken in from a distal end of the lens barrel 11101 is guided to the camera head 11102 and introduced into the lens unit 11401. The lens unit 11401 is configured by combining a plurality of lenses including a zoom lens and a focus lens.

The image pickup unit 11402 includes an imaging element. The number of imaging elements included by the image pickup unit 11402 may be one (single-plate type) or a plural number (multi-plate type). Where the image pickup unit 11402 is configured as that of the multi-plate type, for example, image signals corresponding to respective R, G and B are generated by the imaging elements, and the image signals may be synthesized to obtain a color image. The image pickup unit 11402 may be also configured so as to have a pair of imaging elements for acquiring respective image signals for the right eye and the left eye ready for three dimensional (3D) display. If 3D display is performed, then the depth of a living body tissue in a surgical region can be comprehended more accurately by the surgeon 11131. Note that, in a case where the image pickup unit 11402 is configured as the multi-plate type, a plurality of systems of the lens units 11401 can be provided to correspond to the respective imaging elements.

Furthermore, the image pickup unit 11402 is not necessarily provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Therefore, the magnification and the focal point of a captured image by the image pickup unit 11402 can be adjusted suitably.

The communication unit 11404 includes a communication device configured to transmit and receive various kinds of information to and from the CCU 11201. The communication unit 11404 transmits an image signal acquired from the image pickup unit 11402 as RAW data to the CCU 11201 through the transmission cable 11400.

Furthermore, the communication unit 11404 receives a control signal for controlling driving of the camera head 11102 from the CCU 11201 and supplies the control signal to the camera head controlling unit 11405. The control signal includes information regarding imaging conditions such as, for example, information to designate a frame rate of a captured image, information to designate an exposure value at the time of capturing an image, and/or information to designate a magnification and a focal point of a captured image.

Note that the imaging conditions, such as the frame rate, the exposure value, the magnification, and the focal point, described above may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication device configured to transmit and receive various kinds of information to and from the camera head 11102. The communication unit 11411 receives an image signal transmitted thereto from the camera head 11102 through the transmission cable 11400.

Furthermore, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a captured image obtained by image picking up of the surgical region or the like. For example, the control unit 11413 creates a control signal for controlling driving of the camera head 11102.

Furthermore, the control unit 11413 controls, on the basis of an image signal for which image processes have been performed by the image processing unit 11412, the display apparatus 11202 to display a captured image in which the surgical region or the like is imaged. Thereupon, the control unit 11413 may recognize various objects in the captured image using various image recognition technologies. For example, the control unit 11413 can recognize a surgical tool such as forceps, a particular living body region, bleeding, mist when the energy device 11112 is used and so forth by detecting the shape, color and so forth of edges of objects included in a captured image. The control unit 11413 may cause, when it controls the display apparatus 11202 to display a captured image, various kinds of surgery assistance information to be displayed in an overlapping manner with an image of the surgical region using a result of the recognition. Where surgery assistance information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, communication is performed in a wired manner using the transmission cable 11400 in the example illustrated in the drawing, but the communication between the camera head 11102 and the CCU 11201 may be performed wirelessly.

An example of the endoscopic surgery system to which the technology according to the present disclosure can be applied has been described as above. The technology according to the present disclosure can be applied to, for example, the endoscope 11100, (the image pickup unit 11402 of) the camera head 11102, (the image processing unit 11412 of) the CCU 11201, and the like, among the above-described configurations. Specifically, for example, the imaging device 1 according to each of the above-described embodiments can be applied to the lens unit 11401 and the image pickup unit 10402. When the technology according to the present disclosure is applied to the lens unit 11401 and the image pickup unit 10402, it is possible to achieve downsizing and height reduction and to suppress occurrence of a flare.

Note that, here, the endoscopic surgery system has been described as an example, but the technology according to the present disclosure may be applied to, for example, a microscopic surgery system or the like.

<13. Example of Application to Mobile Body>

The technology according to the present disclosure (present technology) can be applied to various products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a ship, and a robot.

Figure 26:
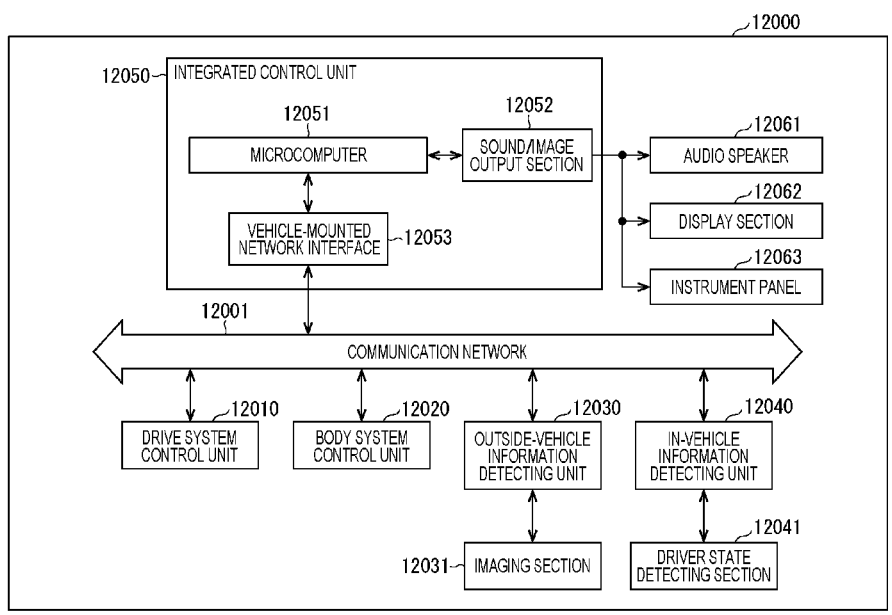
FIG. 26 is a block diagram illustrating an example of a schematic configuration of a vehicle control system.

FIG. 26 is a block diagram illustrating a schematic configuration example of a vehicle control system as an example of a mobile body control system to which the technology according to the present disclosure can be applied.

The vehicle control system 12000 includes a plurality of electronic control units connected to each other via a communication network 12001. In the example illustrated in FIG. 26, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information regarding the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the captured image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information regarding a measured distance. Furthermore, the light received by the imaging section 12031 may be visible light, or may be invisible light such as infrared rays or the like.

The in-vehicle information detecting unit 12040 detects information regarding the inside of the vehicle. The in-vehicle information detecting unit 12040 is, for example, connected with a driver state detecting section 12041 that detects a state of a driver. The driver state detecting section 12041, for example, includes a camera that captures an image of the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information regarding the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

Furthermore, the microcomputer 12051 can perform cooperative control intended for automated driving, which makes the vehicle to travel autonomously without depending on the operation of the driver, or the like, by controlling the driving force generating device, the steering mechanism, the braking device, or the like on the basis of the information regarding the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information regarding the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying information to an occupant of the vehicle or the outside of the vehicle. In the example of FIG. 26, an audio speaker 12061, a display section 12062, and an instrument panel 12063 are illustrated as the output device. The display section 12062 may, for example, include at least one of an on-board display or a head-up display.

Figure 27:
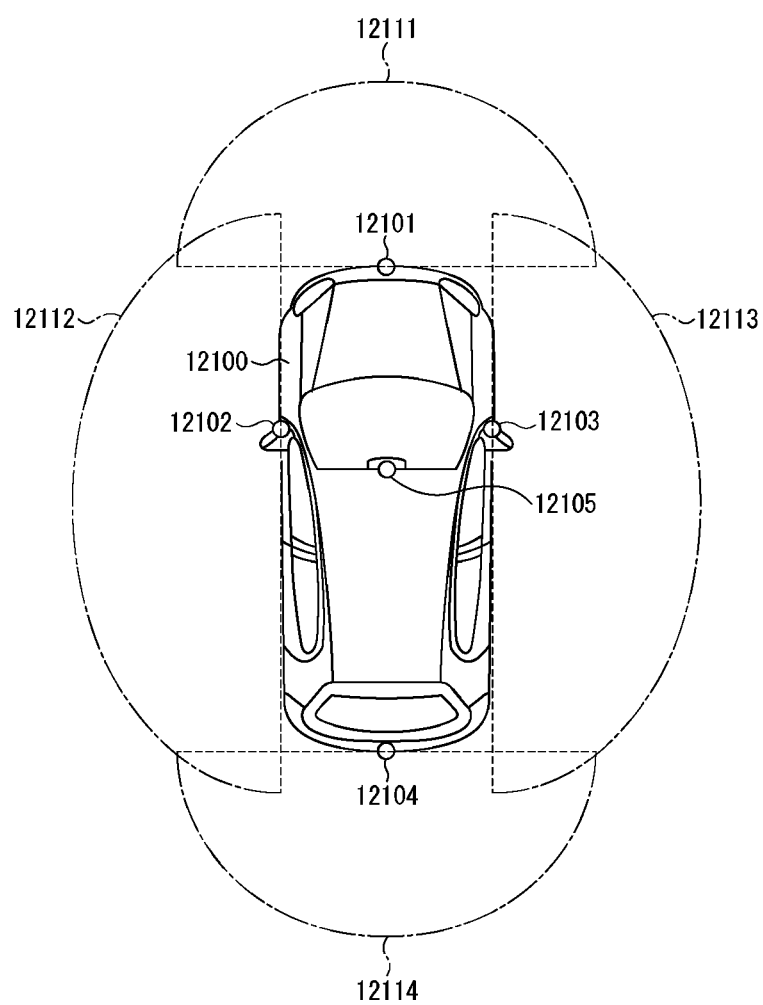
FIG. 27 is an explanatory view illustrating exemplary installation positions of an outside-vehicle information detecting section and an imaging section.

FIG. 27 is a view illustrating exemplary installation positions of the imaging section 12031.

In FIG. 27, a vehicle 12100 includes imaging sections 12101, 12102, 12103, 12104, and 12105 as the imaging sections 12031.

The imaging sections 12101, 12102, 12103, 12104, and 12105 are, for example, arranged at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front acquired by the imaging sections 12101 and 12105 is mainly used to detect a preceding vehicle, a pedestrian, an obstacle, a traffic light, a traffic sign, a lane, and the like.

Note that FIG. 27 illustrates exemplary capturing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. For example, a bird's-eye image of the vehicle 12100 as viewed from above is obtained by superimposing image data imaged by the imaging sections 12101 to 12104.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Moreover, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 distinguish obstacles around the vehicle 12100 between obstacles that are difficult for the driver of the vehicle 12100 to recognize visually and obstacles that are visually recognizable and. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in captured images of the imaging sections 12101 to 12104. Such recognition of a pedestrian is, for example, performed by a procedure of extracting characteristic points in the captured images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the captured images of the imaging sections 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

An example of the vehicle control system to which the technology according to the present disclosure can be applied has been described as above. The technology according to the present disclosure can be applied to, for example, the imaging section 12031 among the above-described configurations. Specifically, for example, the imaging device 1 according to each of the above-described embodiments can be applied to the imaging section 12031. When the technology according to the present disclosure is applied to the imaging section 12031, it is possible to achieve downsizing and height reduction and to suppress occurrence of a flare.

Note that the effects described in the present specification are merely examples and are not limited, and effects other than those described in the present specification may be provided.

Note that the present technology can also have the following configurations.

(1) A sensor package including:
a solid-state imaging element that generates a pixel signal by photoelectric conversion in accordance with a light amount of incident light;
a circuit board electrically connected to the solid-state imaging element;
a sensor package substrate that is arranged on an incident light side of the solid-state imaging element and brings the solid-state imaging element into a sealed state; and
a lens formed on a lower surface of the sensor package substrate, the lower surface being located on a side of the solid-state imaging element.

(2) The sensor package according to the above (1), in which a distance Y from a focal point to an upper surface of the sensor package substrate
satisfies $Y > \{(X \times \sqrt{(A^2/0.02)})/D\}$
where D represents a lens effective aperture, X represents a focal length, and A represents an allowable diameter of dust.

(3) The sensor package according to the above (1) or (2), in which
a film having a filter function is formed on a lower surface of the lens or at least one of an upper surface or a lower surface of the sensor package substrate.

(4) The sensor package according to any one of the above (1) to (3), in which
a material of the sensor package substrate is any of a glass-based material, a resin-based material, and a metal-based material.

(5) The sensor package according to any one of the above (1) to (4), in which
the solid-state imaging element is a sensor that receives incident light of a single wavelength or a sensor that receives incident light of multiple wavelengths.

(6) The sensor package according to any one of the above (1) to (5), in which
a material of the lens is any of a resin material, a glass-based material, and a metal-based material.

(7) The sensor package according to any one of the above (1) to (6), further including
a sensor package holding component that holds the sensor package substrate.

(8) The sensor package according to the above (7), in which
the sensor package holding component has an opening at a position above the solid-state imaging element, and
a side surface of the opening is formed to be inclined in such a way that the opening is wider on either a side of the solid-state imaging element or a side of the sensor package substrate.

(9) The sensor package according to the above (7) or (8), in which
the sensor package holding component is in contact with an upper surface or a lower surface of the sensor package substrate to fix the sensor package substrate.

(10) The sensor package according to any one of the above (7) to (9), in which
the sensor package holding component is a circuit board having an opening at a position above the solid-state imaging element, and
the opening has a same size on a side of the solid-state imaging element and on a side of the sensor package substrate.

(11) The sensor package according to any one of the above (7) to (10), in which
the sensor package holding component has an opening at a position above the solid-state imaging element, and
a planar shape of the opening is a quadrangle or a circle.

(12) The sensor package according to any one of the above (7) to (11), in which
the sensor package holding component has an opening at a position above the solid-state imaging element, and
the lens is held by the sensor package holding component with a side surface of the lens being in contact with a side surface of the opening.

(13) The sensor package according to any one of the above (7) to (12), in which
a contact surface between the sensor package holding component and the lens has an uneven structure.

(14) The sensor package according to any one of the above (7) to (13), further including
a plurality of recessed grooves provided on an upper surface of the sensor package holding component, the upper surface being located on a side of the sensor package substrate.

(15) The sensor package according to the above (7), in which
the sensor package holding component is a circuit board having an opening at a position above the solid-state imaging element, and
a size of the opening is larger than a size of the solid-state imaging element.

(16) The sensor package according to any one of the above (1) to (15), further including
a light shielding film provided in a part of the sensor package substrate or a part of the lens.

(17) The sensor package according to any one of the above (1) to (16), further including:
a lens group that focuses the incident light on a light receiving surface of the solid-state imaging element; and
a drive unit that moves the lens group in an optical-axis direction.

(18) The sensor package according to any one of the above (1) to (17), further including:
a lens group that focuses the incident light on a light receiving surface of the solid-state imaging element; and
a lens holder that fixes the lens group, in which
the lens holder is in contact with an upper surface of the sensor package substrate to fix the sensor package substrate.

(19) The sensor package according to any one of the above (1) to (18), in which
the solid-state imaging element and the circuit board are electrically connected by wire bonding.

(20) A method of manufacturing a sensor package, the method including:
filling a predetermined opening with a lens material in a state where a sensor package holding component in which the predetermined opening is formed is fixed to be in contact with a surface on one side of a sensor package substrate; and
molding the lens material by a mold of a lens and curing the molded lens material to simultaneously bonding the sensor package substrate, the sensor package holding component, and the lens to each other.

(21) An imaging device including:
a sensor package; and
a lens unit including a lens group focusing incident light on a light receiving surface of a solid-state imaging element, the sensor package including:
the solid-state imaging element that generates a pixel signal by photoelectric conversion in accordance with a light amount of the incident light;
a circuit board electrically connected to the solid-state imaging element;
a sensor package substrate that is arranged on an incident light side of the solid-state imaging element and brings the solid-state imaging element into a sealed state; and
a lens formed on a lower surface of the sensor package substrate, the lower surface being located on a side of the solid-state imaging element.

REFERENCE SIGNS LIST

1 Imaging device
11 Sensor package
12 Lens unit
22, 22X Solid-state imaging element
22a Lower substrate (logic substrate)
22b Upper substrate (pixel sensor substrate)
22c Color filter
22d On-chip lens
25 Sensor package substrate
26 Antireflection film
27 Sensor package holding component
28 Lens
29 Antireflection film
31 Lens group
32 Lens barrel (lens holder)
33 AF drive unit
34 Fixing unit
201, 202 Light shielding film
204, 205 uneven portion
206 Circuit board
211 groove
241, 251 Sensor package holding component
250 Antireflection film
253 Light shielding film
254 Antireflection film
281 Lens barrel
291 Lens unit
292 Sensor package functional unit
301 Bonding wire
1001 Imaging device
1002 Optical system
1004 Solid-state imaging element

The invention claimed is:

1. A sensor package, comprising:
a solid-state imaging element configured to generate a pixel signal by photoelectric conversion, wherein the pixel signal is generated based on a light amount of incident light;
a circuit board configured to be electrically connected to the solid-state imaging element;
a sensor package substrate on an incident light side of the solid-state imaging element, wherein the sensor package substrate brings the solid-state imaging element into a sealed state;
a sensor package holding component that holds the sensor package substrate, wherein
the sensor package holding component has an opening at a position above the solid-state imaging element, and
a side surface of the opening is inclined such that the opening is wider on either a side of the solid-state imaging element or a side of the sensor package substrate; and
a lens on a lower surface of the sensor package substrate, wherein the lower surface is on the side of the solid-state imaging element.

2. The sensor package according to claim 1, wherein
a distance Y from a focal point to an upper surface of the sensor package substrate satisfies $Y > \{(X \times \sqrt{(A^2/0.02)})/D\}$,
where D represents a lens effective aperture, X represents a focal length, and A represents an allowable diameter of dust.

3. The sensor package according to claim 1, further comprising
a film on a lower surface of the lens or on at least one of an upper surface of the sensor package substrate or the lower surface of the sensor package substrate, wherein the film has a filter function.

4. The sensor package according to claim 1, wherein
a material of the sensor package substrate is one of a glass-based material, a resin-based material, or a metal-based material.

5. The sensor package according to claim 1, wherein
the solid-state imaging element is a first sensor configured to receive the incident light of a single wavelength or a second sensor configured to receive the incident light of multiple wavelengths.

6. The sensor package according to claim 1, wherein
a material of the lens is one of a resin material, a glass-based material, or a metal-based material.

7. The sensor package according to claim 1, wherein
the sensor package holding component is in contact with an upper surface of the sensor package substrate or the lower surface of the sensor package substrate to fix the sensor package substrate.

8. The sensor package according to claim 1, wherein
a planar shape of the opening is a quadrangle or a circle.

9. The sensor package according to claim 1, wherein
the lens is held by the sensor package holding component with a side surface of the lens being in contact with the side surface of the opening.

10. The sensor package according to claim 1, wherein
a contact surface between the sensor package holding component and the lens has an uneven structure.

11. The sensor package according to claim 1, further comprising
a plurality of recessed grooves on an upper surface of the sensor package holding component, wherein the upper surface is located on the side of the sensor package substrate.

12. The sensor package according to claim 1, wherein
a size of the opening is larger than a size of the solid-state imaging element.

13. The sensor package according to claim 1, further comprising
a light shielding film in a part of the sensor package substrate or a part of the lens.

14. The sensor package according to claim 1, further comprising:
a lens group configured to focus the incident light on a light receiving surface of the solid-state imaging element; and
a drive unit configured to move the lens group in an optical-axis direction.

15. The sensor package according to claim 1, further comprising:
a lens group configured to focus the incident light on a light receiving surface of the solid-state imaging element; and
a lens holder that fixes the lens group, wherein
the lens holder is in contact with an upper surface of the sensor package substrate to fix the sensor package substrate.

16. The sensor package according to claim 1, wherein
the solid-state imaging element and the circuit board are electrically connected by a wire bonding.

17. A method of manufacturing a sensor package, the method comprising:
filling an opening with a lens material in a state where a sensor package holding component is fixed to be in contact with a surface on one side of a sensor package substrate, wherein
the sensor package holding component includes the opening at a position above a solid-state imaging element, and
a side surface of the opening is inclined such that the opening is wider on either a side of the solid-state imaging element or a side of the sensor package substrate;
molding the lens material by a mold of a lens; and
curing the molded lens material to simultaneously bond the sensor package substrate, the sensor package holding component, and the lens to each other.

18. An imaging device, comprising:
a sensor package; and
a lens unit including a lens group configured to focus incident light on a light receiving surface of a solid-state imaging element, wherein
the sensor package includes:
the solid-state imaging element configured to generate a pixel signal by photoelectric conversion, wherein the pixel signal is generated based on a light amount of the incident light;
a circuit board configured to be electrically connected to the solid-state imaging element;
a sensor package substrate on an incident light side of the solid-state imaging element, wherein the sensor package substrate brings the solid-state imaging element into a sealed state;
a sensor package holding component that holds the sensor package substrate, wherein
the sensor package holding component has an opening at a position above the solid-state imaging element, and
a side surface of the opening is inclined such that the opening is wider on either a side of the solid-state imaging element or a side of the sensor package substrate; and
a lens on a lower surface of the sensor package substrate,
wherein the lower surface is on the side of the solid-state imaging element.

* * * * *